United States Patent
Tanaka et al.

(10) Patent No.: US 6,253,364 B1
(45) Date of Patent: Jun. 26, 2001

(54) AUTOMATIC PLACEMENT AND ROUTING DEVICE

(75) Inventors: Genichi Tanaka; Yukihiko Shimazu, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/205,106

(22) Filed: Dec. 3, 1998

(30) Foreign Application Priority Data

Jul. 14, 1998 (JP) .................................................. 10-198757

(51) Int. Cl.⁷ ........................................................ G06F 17/50
(52) U.S. Cl. .................................. 716/13; 716/14; 716/9; 716/10
(58) Field of Search .......................................... 716/1–21

(56) References Cited

U.S. PATENT DOCUMENTS

| | | | |
|---|---|---|---|
| 4,402,044 | * 8/1983 | McDonough et al. ................... | 716/1 |
| 4,811,237 | * 3/1989 | Putatunda et al. ....................... | 716/9 |
| 5,065,355 | * 11/1991 | Hayase .................................. | 716/14 |
| 5,615,126 | * 3/1997 | Deeley et al. .......................... | 716/1 |
| 5,694,328 | * 12/1997 | Hayashi et al. ......................... | 716/9 |
| 5,838,583 | * 11/1998 | Varadarajan et al. ................... | 716/9 |
| 5,867,400 | * 2/1999 | El-Ghoroury et al. .................. | 716/1 |
| 5,930,499 | * 7/1999 | Chen et al. .............................. | 716/8 |
| 5,995,735 | * 11/1999 | Le .......................................... | 716/13 |
| 6,002,857 | * 12/1999 | Ramachandran ....................... | 716/14 |
| 6,110,221 | * 8/2000 | Pai et al. ................................. | 716/8 |

FOREIGN PATENT DOCUMENTS

| | | | |
|---|---|---|---|
| 3-77172 | 4/1991 | (JP) | ................................ G06F/15/60 |
| 4-269860 | 9/1992 | (JP) | ................................ H01L/27/04 |
| 406097370A | * 4/1994 | (JP) | ................................ H01L/27/04 |

OTHER PUBLICATIONS

Gordon et al. ("An N–bus datapath compiler for IC design", Proceedings of the IEEE 1989 Custom Integrated Circuit Conference, May 15, 1989, pp. 23.3/1–23.3/4).*

Drenth et al. ("Datapath layout generation with in–the–cell routing and optimal column resequencing", IEEE, Euro ASIC '91, May 27, 1991, pp. 373–376).*

Huang et al. ("A layout advisor for timing–critical bus routing", Proceedings of the Tenth Annual IEEE International ASIC Conference and Exhibit, Sep. 7, 1997, pp. 210–214).*

Tsui ("A power bus channel router", Proceedings of the IEEE 1988 Custom Integrated Circuits Conference, May 16, 1988, pp. 11.6/1–11.6/4).*

* cited by examiner

Primary Examiner—Matthew Smith
Assistant Examiner—Phallaka Kik
(74) Attorney, Agent, or Firm—Burns, Doane, Swecker & Mathis, LLP

(57) ABSTRACT

There is provided an automatic placement and routing device which automatically performs placement and routing upon cells constituting a logic circuit while optimizing a bus structure. Bus structure construction means (12) constructs the bus structure which is a structure of signal lines for making connection between the cells to provide a bus construction result, based on bus information held in a bus information holding portion (7), cell placement information, constraint information from a constraint information holding portion (9) and logic circuit information from a logic circuit information holding portion (8), when the logic circuit information held in the logic circuit information holding portion (8) does not completely specify the bus structure.

8 Claims, 23 Drawing Sheets

AUTOMATIC PLACEMENT AND ROUTING DEVICE

BACKGROUND OF THE INVENTION

1. Field of the Invention

The present invention relates to an automatic placement and routing device for use in the layout design of a semiconductor integrated circuit and for automatically constructing also a bus structure in placing cells which constitute the semiconductor integrated circuit in position and routing wires for interconnection between the cells.

2. Description of the Background Art

FIG. 26 is a block diagram of a conventional automatic placement and routing device. As shown in FIG. 26, logic circuit information 2 and constraint information 3 are provided to logic circuit information analysis means 5 and constraint information analysis means 6, respectively.

The logic circuit information 2 is text or data information which specifies a logic circuit including a bus structure in netlist format. The constraint information 3 is text or data information which specifies constraints such as (1) timing, (2) power consumption, (3) voltage drop, (4) skew and (5) signal noise resistance which are imposed upon the logic circuit specified by the logic circuit information 2.

The logic circuit information analysis means 5 and the constraint information analysis means 6 analyze the logic circuit information 2 and the constraint information 3 to output analysis results to a logic circuit information holding portion 8 and a constraint information holding portion 9, respectively. The logic circuit information holding portion 8 and the constraint information holding portion 9 hold the respective analysis results therein.

Cell placement means 10 places cells in position based on the information held in the logic circuit information holding portion 8 and the information held in the constraint information holding portion 9. Placement information extraction/verification means 11 extracts (holds) and verifies information about the cell placement (referred to hereinafter as cell placement information).

Global routing means 19 performs global routing for constructing wire paths for interconnection between the cells, based on the cell placement information extracted by the placement information extraction/verification means 11. Global routing information extraction/verification means 20 extracts (holds) and verifies the global routing result.

Detail routing means 21 performs detail routing in consideration for the layout of wires for interconnecting inputs and outputs of the cells, based on the global routing result extracted by the global routing information extraction/verification means 20. Detail routing information extraction/verification means 22 extracts and verifies the detail routing result, and thereafter a routing result holding portion 23 holds the detail routing result therein.

Routing result output means 24 outputs the detail routing result held by the routing result holding portion 23 in the form of a visually recognizable routing result 25.

The conventional placement and routing device has thus performed the placement and routing based on the logic circuit information 2 pertaining to the logic circuit including the bus structure which is specified prior to the placement and routing.

It has hence been difficult to provide a placement and routing result with a satisfactory bus structure on an LSI circuit. Additionally, a change in the bus structure requires a manual modification to the logic circuit information (netlist) itself. The time required for the modification has resulted in an increased time period required for designing the logic circuit.

Further, the conventional automatic placement and routing device does not take the bus structure into consideration for the placement and routing, to render the wires serving as buses longer than necessary, causing the deterioration of characteristics such as the decrease in operating speed and degree of integration, and the increase in power consumption. This results from the fact that the bus structure included in the logic circuit information is constructed without reflecting the placement and routing of the cells.

SUMMARY OF THE INVENTION

According to a first aspect of the present invention, an automatic placement and routing device comprises: cell placement information output means receiving logic circuit information specifying a logic circuit in netlist format for outputting cell placement information specifying the placement of cells constituting the logic circuit, based on the logic circuit information; bus structure construction result output means receiving the logic circuit information, the cell placement information, and bus information specifying transfer of signals between the cells on a logical level for constructing a bus structure including signal lines for making connection between the cells, based on the logic circuit information, the cell placement information and the bus information, to output a bus construction result; and routing establishment means receiving the bus construction result for establishing routing between the cells, based on the bus construction result.

Preferably, according to a second aspect of the present invention, the automatic placement and routing device of the first aspect further comprises global routing result output means for performing global routing for constructing wire paths for interconnection between the cells, based on the cell placement information, to output a global routing result, wherein the bus structure construction result output means outputs the bus construction result, based on the global routing result in addition to the logic circuit information, the cell placement information and the bus information.

Preferably, according to a third aspect of the present invention, the automatic placement and routing device of the first aspect further comprises: global routing result output means for performing global routing for constructing wire paths for interconnection between the cells, based on the cell placement information, to output a global routing result; and detail routing result output means for performing detail routing which is routing in consideration of a layout for connection between the cells, based on the global routing result, to output a detail routing result, wherein the bus structure construction result output means outputs the bus construction result, based on the detail routing result in addition to the logic circuit information, the cell placement information and the bus information.

Preferably, according to a fourth aspect of the present invention, in the automatic placement and routing device of the first aspect, the bus structure construction result output means comprises bus structure construction means for providing the signal lines to construct the bus structure, the bus structure construction means comprising: cluster construction means for combining a plurality of cells and existing clusters which satisfy a predetermined condition together to construct a new cluster; in-cluster connection construction means for constructing signal lines for making connection between cells in the cluster constructed by the cluster construction means; and operation control means for causing the cluster construction means and the in-cluster connection construction means to continue their operations until the cluster covers all of the cells constituting the logic circuit.

Preferably, according to a fifth aspect of the present invention, in the automatic placement and routing device of the fourth aspect, the bus information includes information which specifies control of the transfer of signals between cells on a logical level, and the bus structure includes a bus control signal for controlling the continuity/cutoff of each of the signal lines; and the bus structure construction result output means further comprises bus control signal construction means for constructing the bus control signal independently of the bus structure construction means.

Preferably, according to a sixth aspect of the present invention, in the automatic placement and routing device of the fifth aspect, the logic circuit information includes bus structure information which specifies the bus structure; and the bus structure construction result output means further comprises bus structure reconstruction means for reconstructing the bus structure specified by the logic circuit information.

Preferably, according to a seventh aspect of the present invention, in the automatic placement and routing device of the fifth aspect, the bus structure construction result output means further comprises bus structure reconstruction means for reconstructing the bus structure constructed by the bus structure construction means and the bus control signal construction means, the bus structure reconstruction means comprising: cluster anomaly extraction means for extracting overlap of cluster regions and wire cross-over between different clusters; and cluster recombination means for recombining clusters so as to eliminate the overlap of the cluster regions and the wire cross-over which are extracted by the cluster anomaly extraction means.

Preferably, according to an eighth aspect of the present invention, in the automatic placement and routing device of the first aspect, the bus structure construction result output means receives at least one item of judgement information among items of information pertaining to the degree of congestion of routing, clusters, node potentials, power consumption and skew, to output the bus construction result so that a condition indicated by the at least one item of judgment information is satisfied.

Preferably, according to a ninth aspect of the present invention, in the automatic placement and routing device of the eighth aspect, the at least one item of judgement information includes a plurality of items of judgement information, and the bus structure construction result output means further receives priority weight information specifying priority weight of each of the plurality of items of judgment information, to output the bus construction result so that the condition indicated by the plurality of items of judgement information is satisfied according to the priority weight specified by the priority weight information.

Preferably, according to a tenth aspect of the present invention, in the automatic placement and routing device of the first aspect, the bus structure construction result output means constructs the bus structure while forming a trunk wire connected commonly to a plurality of signal lines, to output the bus construction result.

As described hereinabove, the bus structure construction result output means of the automatic placement and routing device in accordance with the first aspect of the present invention constructs the bus structure including the signal lines for making connection between the cells, based on the logic circuit information, the cell placement information and the bus information, to output the bus construction result.

Consequently, the automatic placement and routing device of the first aspect can construct the bus structure which reflects the actual cell placement to perform the automatic placement and routing upon the cells constituting the logic circuit while optimizing the bus structure.

The bus structure construction result output means of the automatic placement and routing device in accordance with the second aspect of the present invention outputs the bus construction result, based on also the global routing result provided by constructing the wire paths for interconnection between the cells. Therefore, the automatic placement and routing device of the second aspect can construct the bus structure which reflects the actual cell placement and the global routing to perform the automatic placement and routing upon the cells constituting the logic circuit while further optimizing the bus structure.

The bus structure construction result output means of the automatic placement and routing device in accordance with the third aspect of the present invention outputs the bus construction result, based on also the detail routing result which is the result of the routing in consideration of layout for connection between the cells. Therefore, the automatic placement and routing device of the third aspect can construct the bus structure which reflects the actual cell placement and the detail routing to perform the automatic placement and routing upon the cells constituting the logic circuit while much further optimizing the bus structure.

The bus structure construction means of the bus structure construction result output means of the automatic placement and routing device in accordance with the fourth aspect of the present invention comprises: the cluster construction means for combining the plurality of cells and existing clusters which satisfy the predetermined condition together to construct the new cluster; the in-cluster connection construction means for constructing the signal lines for making connection between the cells in the cluster constructed by the cluster construction means; and the operation control means for causing the cluster construction means and the in-cluster connection construction means to continue their operations until the cluster covers all of the cells constituting the logic circuit. Thus, the bus structure construction means can construct the signal lines for each cluster while providing the clusters of increasing size in a step-by-step manner.

The bus structure construction result output means of the automatic placement and routing device in accordance with the fifth aspect of the present invention comprises the bus control signal construction means for constructing the bus control signal independently of the bus structure construction means. The bus control signal may be constructed concurrently with the signal line construction processing of the bus structure construction means. This shortens the time required for construction of the bus structure with the bus control signal.

In the automatic placement and routing device in accordance with the sixth aspect of the present invention, the logic circuit information includes the bus structure information which specifies the bus structure; and the bus structure construction result output means further comprises the bus structure reconstruction means for reconstructing the bus structure specified by the logic circuit information.

Thus, if the bus structure specified by the bus structure information included in the logic circuit information does not reflect the actual cell placement, the bus structure reconstruction means can reconstruct the bus structure which reflects the actual cell placement.

The bus structure reconstruction means of the automatic placement and routing device in accordance with the seventh aspect of the present invention comprises: the cluster anomaly extraction means for extracting overlap of cluster regions and wire crossover between different clusters; and the cluster recombination means for recombining the clusters so as to eliminate the overlap of the cluster regions and the wire cross-over which are extracted by the cluster anomaly extraction means.

Thus, if the bus structure includes the clusters which cause the overlap of the cluster regions or the wire cross-over, the cluster anomaly extraction means and the cluster recombination means can recombine the clusters to reconstruct the bus structure in which the overlap of the cluster regions or the wire cross-over is eliminated.

The bus structure construction result output means of the automatic placement and routing device in accordance with the eighth aspect of the present invention outputs the bus construction result so that the condition indicated by at least one item of judgement information is satisfied among the items of information pertaining to the degree of congestion of routing, clusters, node potentials, power consumption and skew, thereby to construct the bus structure conforming to the practical level.

In the bus structure construction result output means of the automatic placement and routing device in accordance with the ninth aspect of the present invention, the condition indicated by the plurality of items of judgement information is satisfied according to the priority weights based on the indication contents of the priority weight information. Thus, the bus structure construction result output means can construct the bus structure more conforming to the practical level.

The bus structure construction result output means of the automatic placement and routing device in accordance with the tenth aspect of the present invention constructs the bus structure while forming the trunk wire connected commonly to the plurality of signal lines, to output the bus construction result. This accomplishes the optimization of the bus structure including the trunk wire.

It is therefore an object of the present invention to provide an automatic placement and routing device for automatically performing placement and routing on cells constituting a logic circuit while optimizing a bus structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram for illustrating the operation of bus structure construction means and the like;

FIG. 16 is a circuit diagram for illustrating the operation of cluster recombination means and the like;

DESCRIPTION OF THE PREFERRED EMBODIMENTS

<First Preferred Embodiment>

Figure 1:
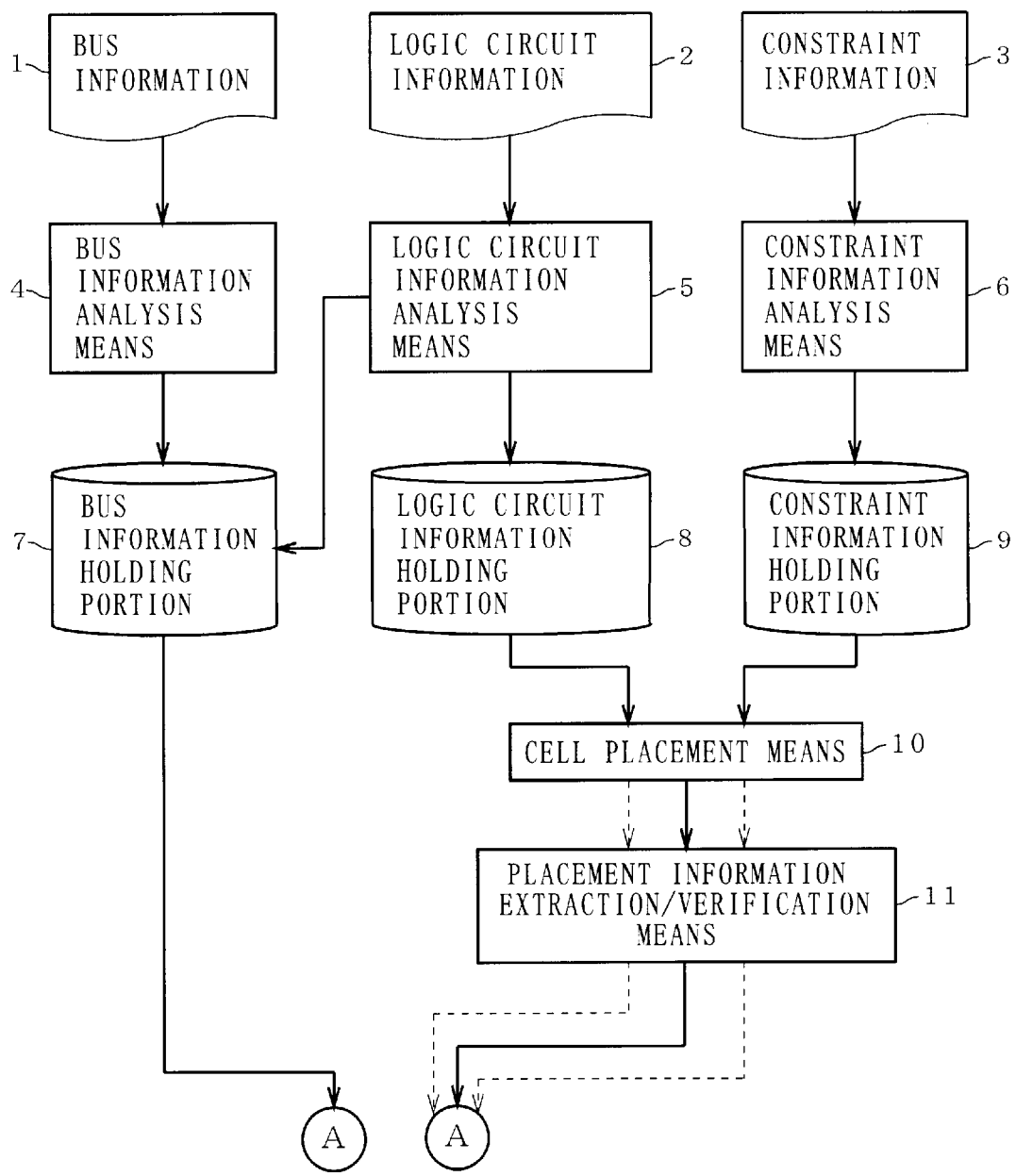
FIGS. 1 and 2 are block diagrams of an automatic placement and routing device according to a first preferred embodiment of the present invention.
Figure 2:
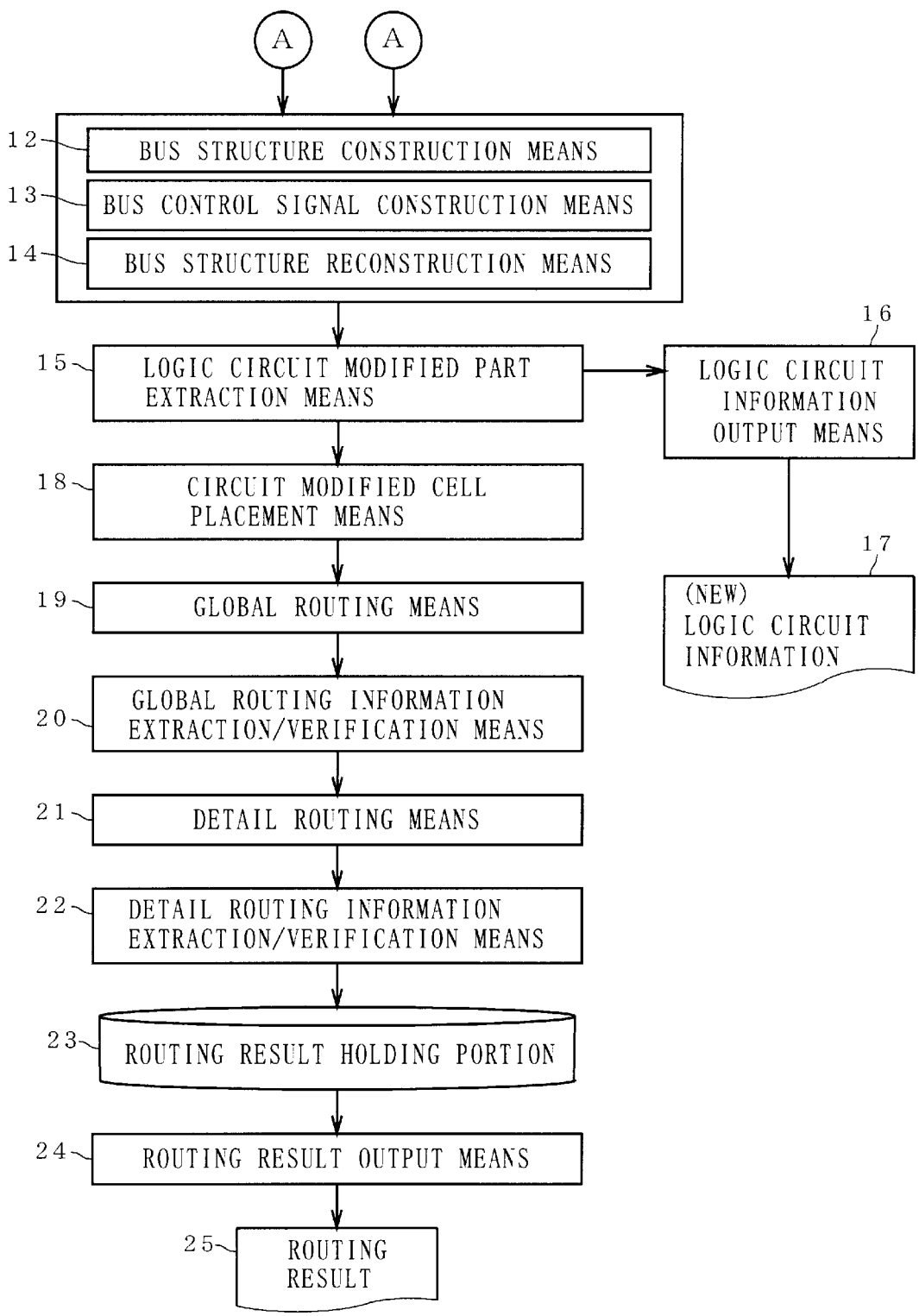

FIGS. 1 and 2 are block diagrams of an automatic placement and routing device according to a first preferred embodiment of the present invention. As shown in FIGS. 1 and 2, bus information 1, logic circuit information 2, and constraint information 3 are provided to bus information analysis means 4, logic circuit information analysis means 5, and constraint information analysis means 6, respectively.

The bus information 1 is text or data information which specifies signal transfer between cells on a logical level, and contains bus names, a list of bus drive cells, a list of bus signal receiving cells, a list of via-bus data transfer patterns (information specifying cells between which data transfer is permitted among cells connected to buses), a bus control signal system table, and the like. The logic circuit information 2 is text or data information which specifies a logic circuit in netlist format. The constraint information 3 is text or data information which specifies constraints such as (1) timing, (2) power consumption, (3) voltage drop, (4) skew and (5) signal noise resistance which are imposed upon the logic circuit specified by the logic circuit information 2.

The bus information analysis means 4, the logic circuit information analysis means 5, and the constraint information analysis means 6 analyze the bus information 1, the logic circuit information 2, and the constraint information 3 to output analysis results to a bus information holding portion 7, a logic circuit information holding portion 8, and a constraint information holding portion 9, respectively. The bus information holding portion 7, the logic circuit information holding portion 8 and the constraint information holding portion 9 hold the respective analysis results therein. The logic circuit information analysis means 5 also outputs to the bus information holding portion 7 the result of analysis of information associated with a bus structure which is included in the logic circuit information 2, and the bus information holding portion 7 holds this result therein.

Cell placement means 10 places cells in position based on the information held in the logic circuit information holding portion 8 and the information held in the constraint information holding portion 9. Placement information extraction/verification means 11 extracts (holds) and verifies placement information which specifies the placement of the cells.

The information held in the bus information holding portion 7, the cell placement information, and the information held in the logic circuit information holding portion 8 and the constraint information holding portion 9 (provided through the cell placement means 10 and the placement information extraction/verification means 11) are provided to a bus structure construction group comprised of bus structure construction means 12, bus control signal construction means 13, and bus structure reconstruction means 14.

If the logic circuit information held in the logic circuit information holding portion 8 does not completely specify a bus structure (e.g., a simply connected bus structure is designated or the details of the bus structure are not specified), the bus structure construction means 12 constructs a bus structure which is a structure of signal lines which connect the cells to each other, to provide a bus construction result, based on the bus information held in the bus information holding portion 7, the cell placement information, the constraint information from the constraint information holding portion 9, and the logic circuit information from the logic circuit information holding portion 8. Then, construction result holding means to be described later holds the bus construction result therein.

If the logic circuit information held in the logic circuit information holding portion 8 does not completely specify a bus control signal (e.g., a simply connected bus control signal is designated or the details of the bus control signal are not specified), the bus control signal construction means 13 constructs a bus control signal to provide a bus control signal construction result, based on the bus information held in the bus information holding portion 7, the cell placement information, the constraint information from the constraint information holding portion 9, and the logic circuit information from the logic circuit information holding portion 8. Then, the construction result holding means to be described later holds the bus control signal construction result therein. The bus control signal means a signal provided for (bidirectional or mono-directional) signal lines for controlling the continuity/cutoff (i.e., routing/not routing) of each of the signal lines for each direction.

The bus control signal construction means 13 sometimes operates at the same time as the bus structure construction means 12 and sometimes operates alone. The operation of the bus control signal construction means 13 at the same time as the bus structure construction means 12 may reduce the time required to construct a bus structure with a bus control signal, which is comprised of the bus structure and the bus control signal.

As above described, if the background art complete bus structure is not specified in the logic circuit information 2, the first preferred embodiment may automatically generate the logic circuit information containing the bus structure with the bus control signal, which is comprised of the bus structure and the bus control signal, constructed by the bus structure construction means 12 and the bus control signal construction means 13.

If the bus structure is specified in the logic circuit information and the bus structure constructed by the bus structure construction means 12 and the bus control signal construction means 13 is imperfect, the bus structure reconstruction means 14 reconstructs the bus structure to generate logic circuit information, based on the bus information held in the bus information holding portion 7, the cell placement information, the constraint information from the constraint information holding portion 9, and the logic circuit information from the logic circuit information holding portion 8.

Thus, if the bus structure specified by the bus structure information included in the logic circuit information 2 does not reflect the actual cell placement or if the bus structure constructed by the bus structure construction means 12 is imperfect, the bus structure reconstruction means 14 may reconstruct the bus structure which reflects the actual cell placement.

Logic circuit modified part extraction means 15 extracts a part of the logic circuit which is required to be modified as a result of the bus structure constructed or reconstructed by the bus structure construction means 12, the bus control signal construction means 13 and the bus structure reconstruction means 14.

Logic circuit information output means 16 outputs visually recognizable logic circuit information 17 which specifies the modified logic circuit, based on the logic circuit modified result extracted by the logic circuit modified part extraction means 15.

Circuit modified cell placement means 18 outputs modified cell information pertaining to the cells placed in the modified part extracted by the logic circuit modified part extraction means 15.

Global routing means 19 performs global routing for constructing wire paths for interconnection between the cells, based on the cell placement information (provided through the means 12 to 15, and 18) extracted by the placement information extraction/verification means 11 and the modified cell information. Global routing information extraction/verification means 20 extracts (holds) and verifies the global routing result.

Detail routing means 21 performs detail routing in consideration for the layout of wires for interconnecting inputs and outputs of the cells to establish routing, based on the global routing result extracted by the global routing information extraction/verification means 20. Detail routing information extraction/verification means 22 extracts and verifies the detail routing result. A routing result holding portion 23 holds the detail routing result therein.

Routing result output means 24 outputs the detail routing result held in the routing result holding portion 23 in the form of a visually recognizable routing result 25.

Figure 3:
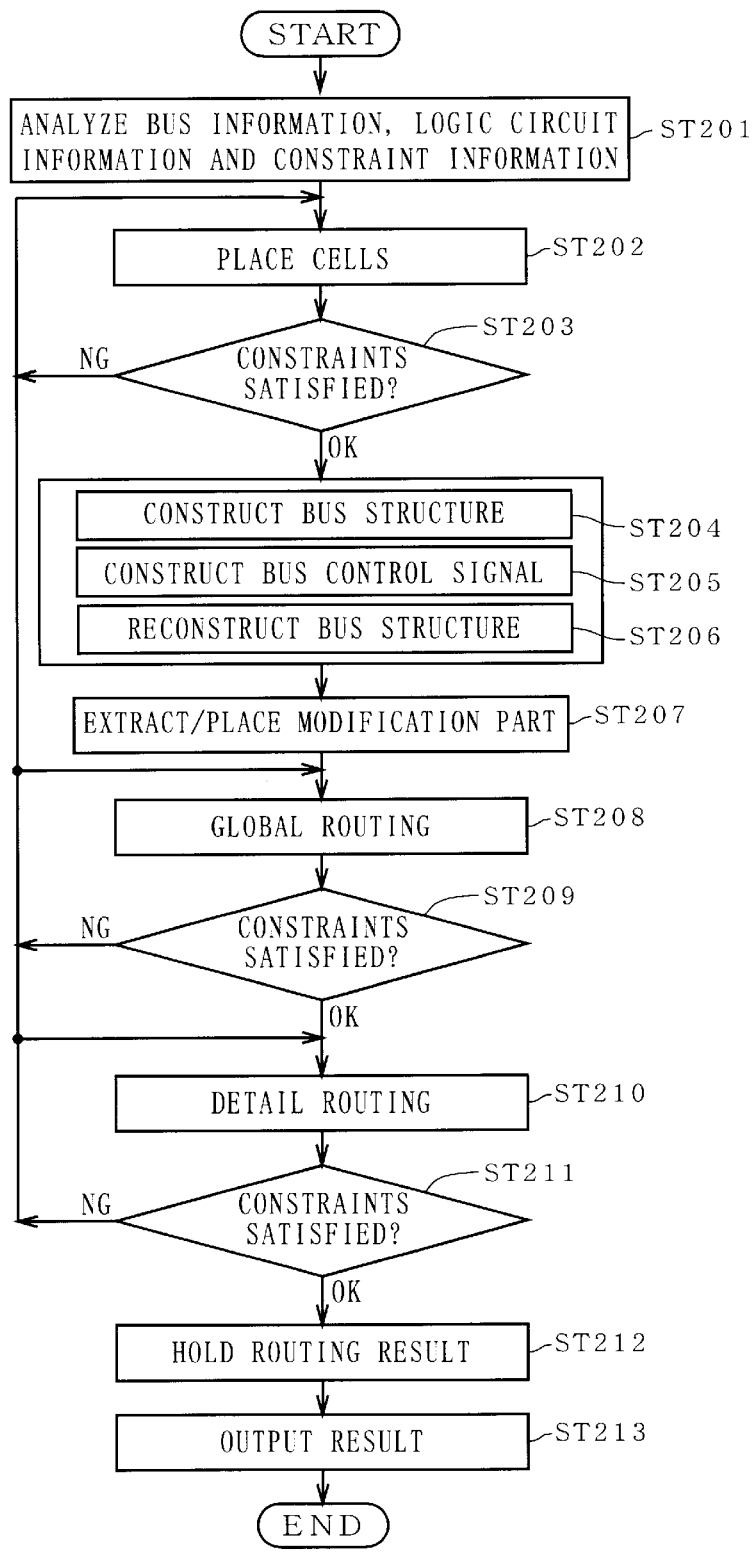
FIG. 3 is a flowchart showing the operation of the automatic placement and routing device of the first preferred embodiment.

FIG. 3 is a flowchart showing the operation of the automatic placement and routing device having the configuration shown in FIGS. 1 and 2. The operation of the automatic placement and routing device will be described with reference to the flowchart of FIG. 3.

Initially, in the step ST201, the bus information 1, the logic circuit information 2 and the constraint information 3 for a circuit wherein buses are to be designed are analyzed by the bus information analysis means 4, the logic circuit information analysis means 5 and the constraint information analysis means 6, respectively, and the respective analysis results are held in the bus information holding portion 7, the logic circuit information holding portion 8, and the constraint information holding portion 9. At this time, the result of the analysis from the logic circuit information analysis means 5 which is associated with the bus structure is also held in the bus information holding portion 7.

Then, in the step ST202, the cell placement means 10 constructs a floor plan (a plan about where to place a circuit which implements one function in the entire region), based on the information held in the logic circuit information holding portion 8 and the constraint information holding portion 9. Thereafter, the cell placement means 10 places the cells in position to output the cell placement information.

In the step ST203, the placement information extraction/verification means 11 extracts the cell placement information to verify whether or not the placement of the cells specified by the cell placement information is inconsistent with the constraint information held in the constraint information holding portion 9. If there is inconsistency (NG) in the step ST203, the flow returns to the step ST202 for prompting for one more placement of the cells. If there is no inconsistency (OK) in the step ST203, the flow proceeds to the step ST204. The input constraint information 3 may be modified if there is inconsistency in the step ST203.

Thereafter, the processing in the steps ST204 to ST206 to be described below is performed.

In the step ST204, the bus structure construction means 12 constructs the bus structure based on the cell placement information extracted by the placement information extraction/verification means 11, the bus information held in the bus information holding portion 7, the logic circuit information held in the logic circuit information holding portion 8, and the constraint information held in the constraint information holding portion 9.

Figure 4:
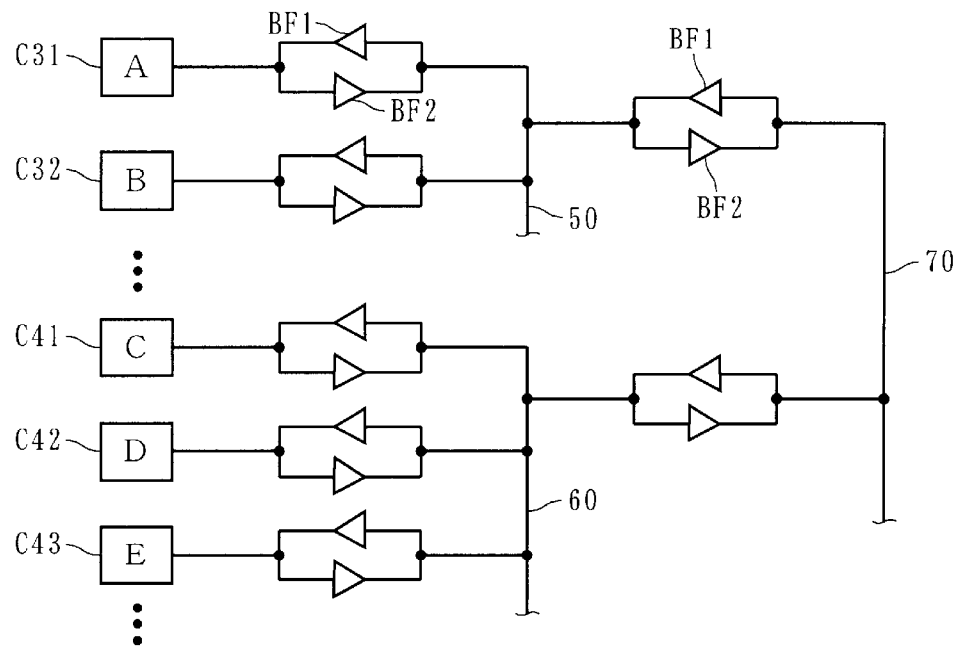

With reference to FIG. 4, for example, if cells C31 and C32 and cells C41 to C43 are judged as two adjacent groups of cells, a bus structure is constructed such that a combination of a buffer BF1 for a receiver (referred to hereinafter as a receiver buffer) and a buffer BF2 for a driver (referred to hereinafter as a driver buffer) is connected to each of the cells C31, C32, and C41 to C43; a signal line 50 serves as a common wire to the cells C31 and C32; a signal line 60 serves as a common wire to the cells C41 to C43; and a signal line 70 is connected to each of the signal lines 50 and 60 through a combination of a receiver buffer BF1 and a driver buffer BF2.

In the step ST205, the bus control signal construction means 13 constructs the bus control signal based on the placement information extracted by the placement information extraction/verification means 11, the bus information held in the bus information holding portion 7, the logic circuit information held in the logic circuit information holding portion 8, and the constraint information held in the constraint information holding portion 9.

The simplest bus control signal constructed by the bus control signal construction means 13 is of a construction such that a selector circuit for controlling the operation of each pair of the receiver buffer BF1 and the driver buffer BF2 as shown in FIG. 4 is formed for all data transfer patterns. Further, in the next stage, redundant parts are removed for increase in efficiency. For instance, if it is found that the cells C31 and C32 do not simultaneously operate in the example of FIG. 4, the efficiency may be increased, for example, by normally operating the receiver and driver buffers BF1 and BF2 connected between the signal line 50 and the cells C31 and C32 (removing the selector circuit) and by providing a selector circuit for controlling the operation of the receiver and driver buffers BF1 and BF2 between the signal lines 50 and 70. Furthermore, if the cells C31 and C32 simultaneously operate and perform necessarily inverted input/output operations, the efficiency may be increased by eliminating the receiver and driver buffers BF1 and BF2 directly connected to the cells C31 and C32.

Referring again to FIG. 3, in the step ST206, the bus structure reconstruction means 14 reconstructs the bus structure based on the placement information extracted by the placement information extraction/verification means 11, the bus information held in the bus information holding portion 7, the logic circuit information held in the logic circuit information holding portion 8, and the constraint information held in the constraint information holding portion 9.

Figure 5:
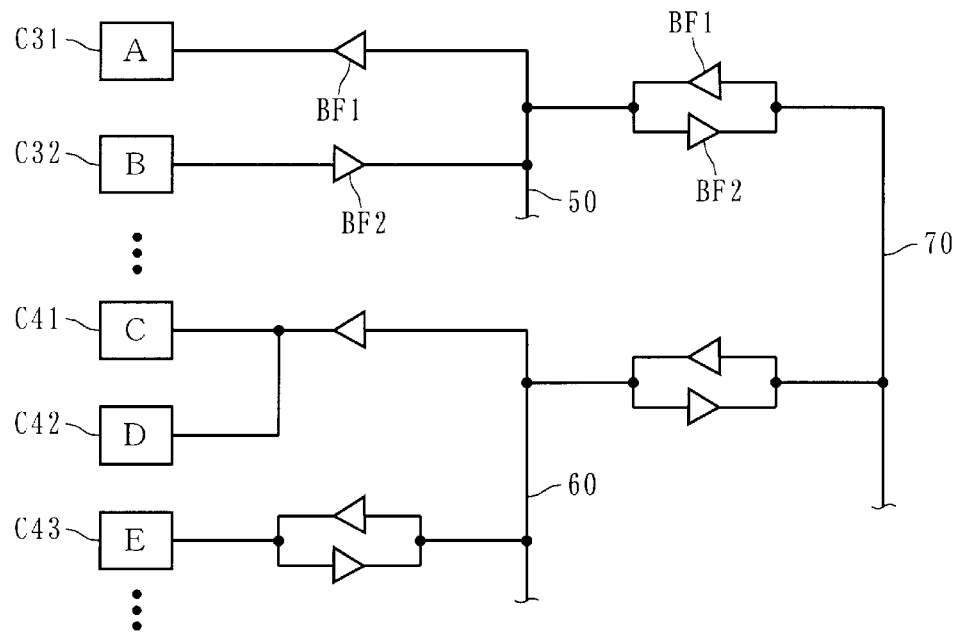
FIG. 5 is a circuit diagram for illustrating the operation of bus structure reconstruction means.

For example, if it is found in the bus structure shown in FIG. 4 that the cell C31 has only a signal input, the cell C32 has only a signal output, and the cells C41 and C42 have only a common signal input, the bus structure is reconstructed as shown in FIG. 5. Specifically, the driver buffer BF2 for the cell C31, the receiver buffer BF1 for the cell C32, and the driver buffers BF2 for the cells C41 and C42 are removed, and a single receiver buffer BF1 common to the cells C41 and C42 is provided.

In some cases, the step ST205 is executed at the same time as the step ST204 or the step ST206. The processing in the steps ST204 and ST206 is performed in an alternative manner.

Upon completion of the processing in the steps ST204 to ST206, the logic circuit modified part extraction means 15 extracts the bus-associated logic circuit information newly constructed by the bus structure construction means 12, the bus control signal construction means 13 and the bus structure reconstruction means 14, in the step ST207. Thereafter, the circuit modified cell placement means 18 outputs the modified cell information pertaining to only the cells constituting the modified logic circuit.

In the step ST208, the global routing means 19 performs the global routing for constructing the wire paths for interconnection between the cells, based on the cell placement information (provided through the means 12 to 15, and 18) extracted by the placement information extraction/verification means 11 and the modified cell information.

In the step ST209, the global routing information extraction/verification means 20 extracts the result of the global routing performed by the global routing means 19 to verify whether or not the global routing result is inconsistent with the constraint information held in the constraint information holding portion 9. If there is inconsistency (NG), the flow returns to the step ST208 for the global routing or to the step ST202 for one more placement of the cells (in the case where the existence of inconsistency is found a predetermined number of times in the step ST209). The input constraint information 3 may be modified if there is inconsistency in the step ST209. On the other hand, if there is no inconsistency (OK) in the step ST209, the flow proceeds to the step ST210.

In the step ST210, the detail routing means 21 performs the detail routing based on the global routing result provided by the global routing means 19.

Then, in the step ST211, the detail routing information extraction/verification means 22 extracts the detail routing result to verify whether or not the detail routing result is inconsistent with the constraint information held in the constraint information holding portion 9. If there is inconsistency (NG), the flow returns to the step ST210 for the detail routing, to the step ST208 for the global routing or to the step ST202 for one more placement of the cells. The input constraint information 3 may be modified if there is inconsistency in the step ST211. On the other hand, if there is no inconsistency (OK) in the step ST211, the flow proceeds to the step ST212.

In the step ST212, the routing result holding portion 23 holds therein the detail routing result extracted by the detail routing information extraction/verification means 22. Thereafter, in the step ST213, the routing result output means 24 outputs the visually recognizable routing result 25 based on the contents held in the routing result holding portion 23.

Figure 6:
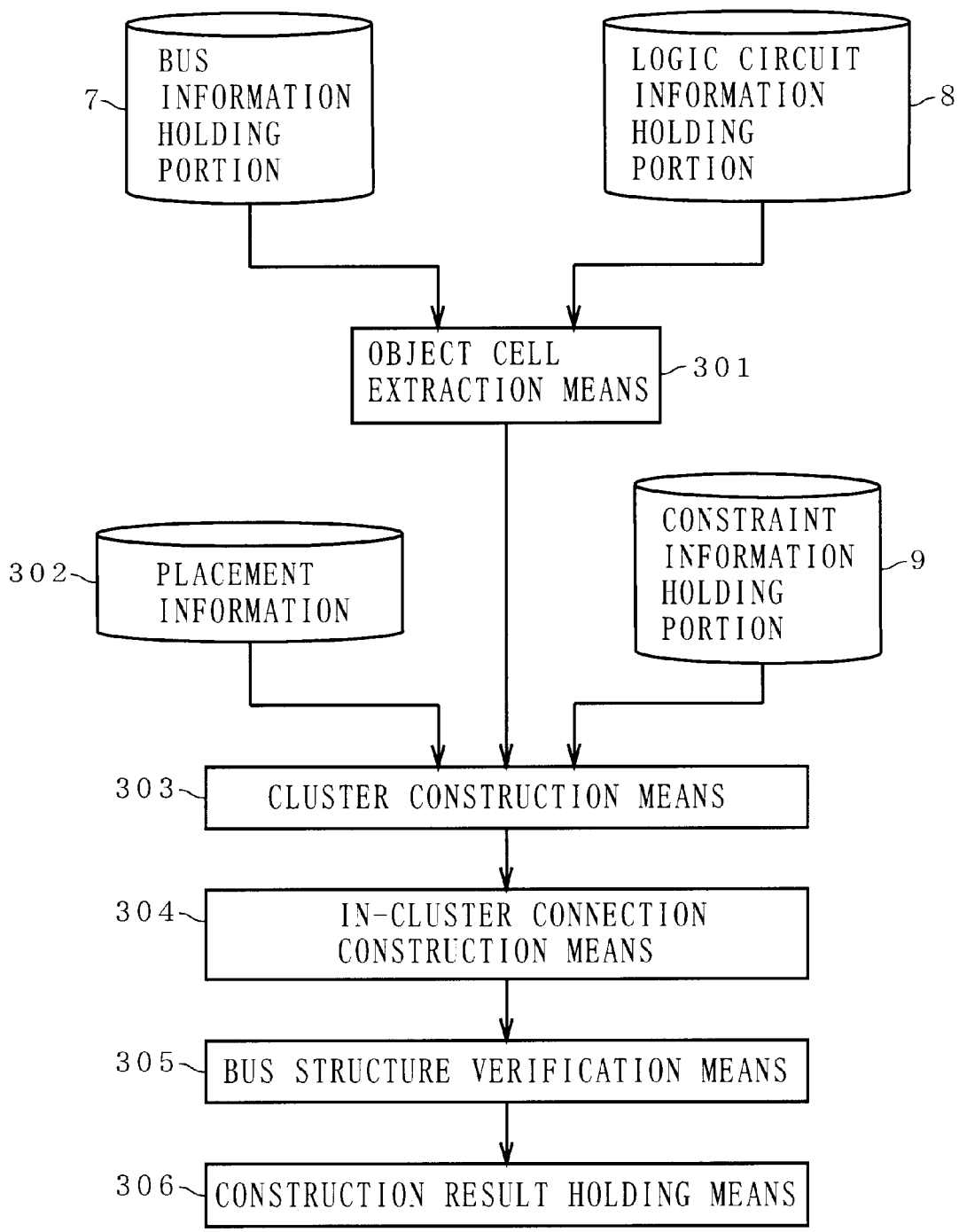
FIG. 6 is a block diagram of the bus structure construction means.

FIG. 6 is a block diagram of the bus structure construction means 12. In FIG. 6, placement information 302 is the cell placement information provided from the placement information extraction/verification means 11. Although the information held in the logic circuit information holding portion 8 and the information held in the constraint information holding portion 9 are provided through the cell placement means 10 and the placement information extraction/verification means 11, the illustration of the cell placement means 10 and the placement information extraction/verification means 11 is omitted in FIG. 6 for purposes of illustration. Similar omission of illustration is done also in FIGS. 12, 14 and 24.

The logic circuit specified by the logic information held in the logic circuit information holding portion 8 shall have a flat bus structure.

Object cell extraction means 301 extracts object cells that transfer data to and from buses, based on the bus information held in the bus information holding portion 7 and the logic circuit information held in the logic circuit information holding portion 8.

Cluster construction means 303 constructs clusters, with the constraint information held in the constraint information holding portion 9 being satisfied, based on the cell placement information 302 and the extracted cell information extracted by the object cell extraction means 301. The clusters are constructed so that cells placed adjacent to each other basically constitute the same cluster.

In-cluster connection construction means 304 constructs the signal lines for connecting the cells in the clusters constructed by the cluster construction means 303 on a practical level, for example, in the form of a tree structure. In this case, a buffer is inserted as required in signal lines within the clusters.

Bus structure verification means 305 verifies whether or not the bus structure including the signal lines constructed by the in-cluster connection construction means 304 is correct in terms of a logic circuit and satisfies the constraint information (provided through the means 303 and 304) held in the constraint information holding portion 9.

Construction result holding means 306 holds the bus structure constructed by the in-cluster connection construction means 304 and verified by the bus structure verification means 305.

Figure 7:
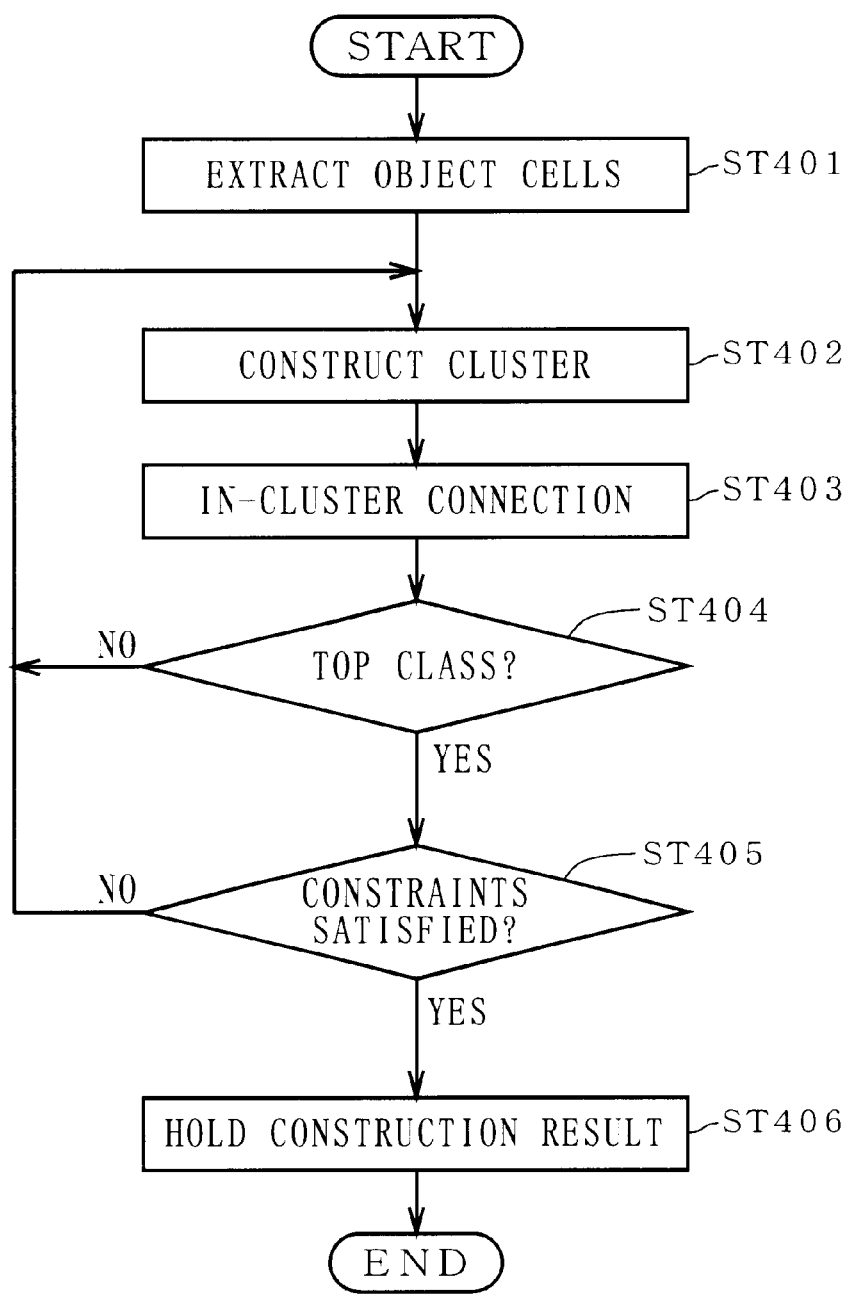
FIG. 7 is a flowchart showing the operation of the bus structure construction means.

FIG. 7 is a flowchart showing the operation of the bus structure construction means 12.

Referring to FIG. 7, in the step ST401, the object cell extraction means 301 extracts the object cells that transfer data to and from buses, based on the information held in the bus information holding portion 7 and the logic circuit information holding portion 8.

In the step ST402, the cluster construction means constructs a cluster of one class, based on the placement information 302 and the information held in the logic circuit information holding portion 8.

In the step ST403, the in-cluster connection construction means 304 constructs the signal lines for connection in the cluster constructed in the step ST402.

In the step ST404, the bus structure verification means 305 verifies whether or not the cluster constructed in the step ST402 is in a top class (containing all of the cells). If the cluster is in the top class (YES), the flow proceeds to the step ST405. If the cluster is not in the top class (NO), the flow returns to the step ST402 for construction of a cluster of a higher class.

The steps ST402 to ST404 are repeated until the top class is recognized in the step ST404.

Figure 8:
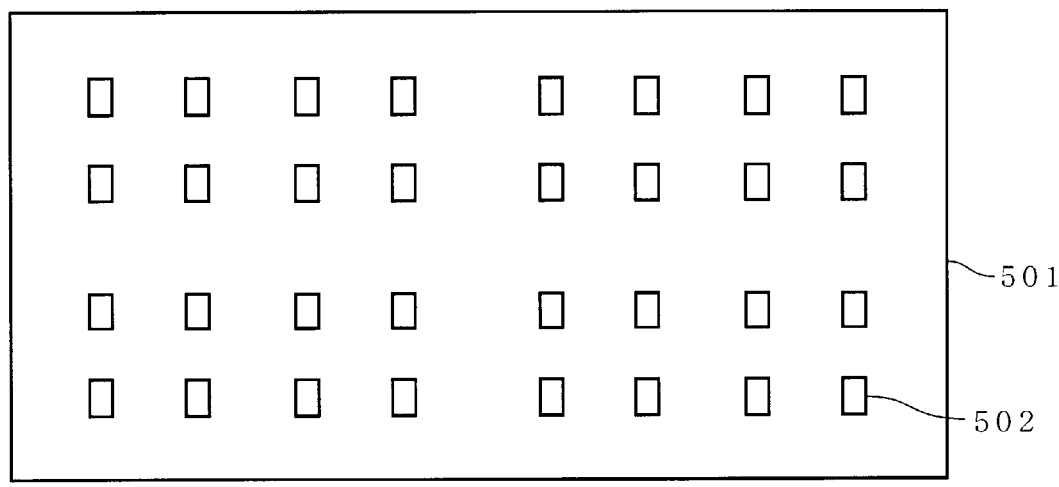
FIGS. 8 through 11 illustrate the operation of cluster construction means and in-cluster connection construction means.
Figure 9:
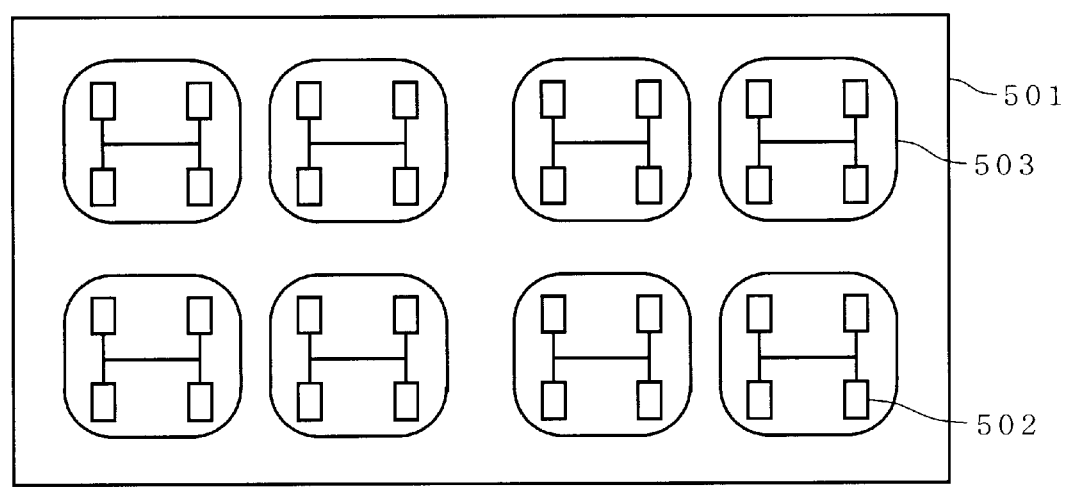
Figure 10:
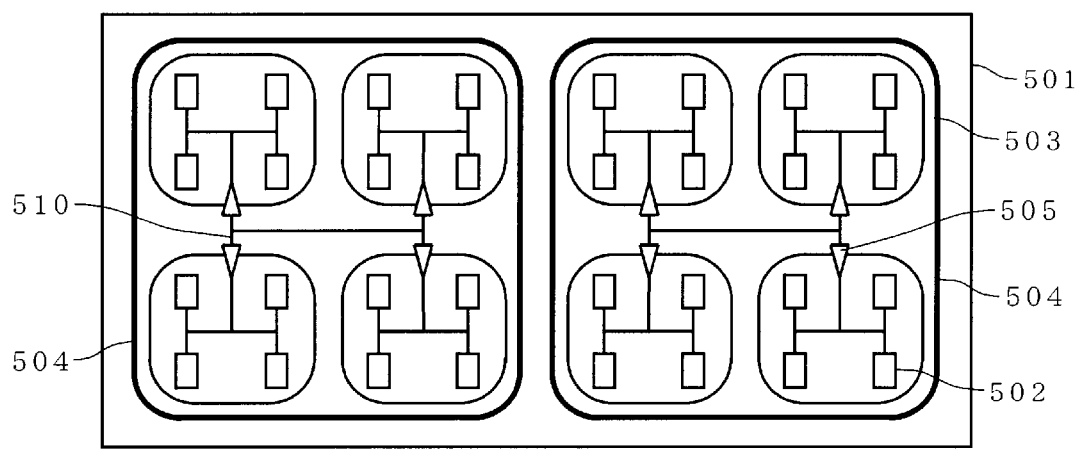
Figure 11:
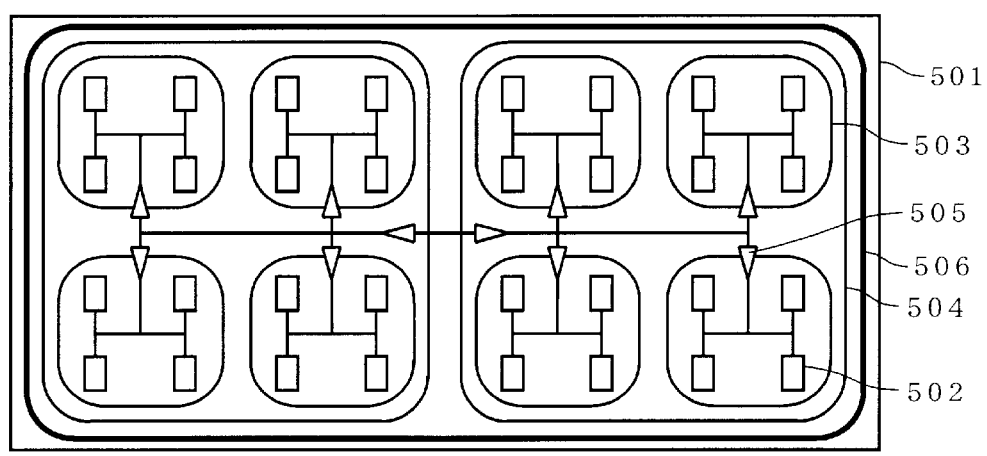

An example of the processing in the steps ST402 to ST404 will be described with reference to FIGS. 8 through 11. It is assumed that cells 502 extracted by the object cell extraction means 301 are placed as shown in FIG. 8 within an entire object circuit 501. In this state, when the cluster construction means 303 and the in-cluster connection construction means 304 execute the steps ST402 and ST403 a first time, clusters 503 of one class are constructed as shown in FIG. 9. When the steps ST402 and ST403 are executed a second time, clusters 504 of the class higher by one than the class of the clusters 503 are constructed as show in FIG. 10. At this time, buffers 505 are inserted as required in signal lines 510 which make connection between the clusters. Thereafter, when the steps ST402 and ST403 are executed a third time, a cluster 506 of the top class is provided as shown in FIG. 11. Then, the result in the step ST404 is "YES", and the flow proceeds to the step ST405.

Referring again to FIG. 7, in the step ST405, the bus structure verification means 305 verifies whether or not the resultant bus structure is inconsistent with the constraint information held in the constraint information holding portion 9. If the bus structure satisfies the constraint information (YES), the flow proceeds to the step ST406. If the bus structure does not satisfy the constraint information (NO), the flow returns to the step ST402 for prompting for one more construction of clusters.

On the other hand, if the bus structure satisfies the constraint information in the step ST405, the construction result holding means 306 holds therein the result of construction of the bus structure in the step ST406.

Figure 12:
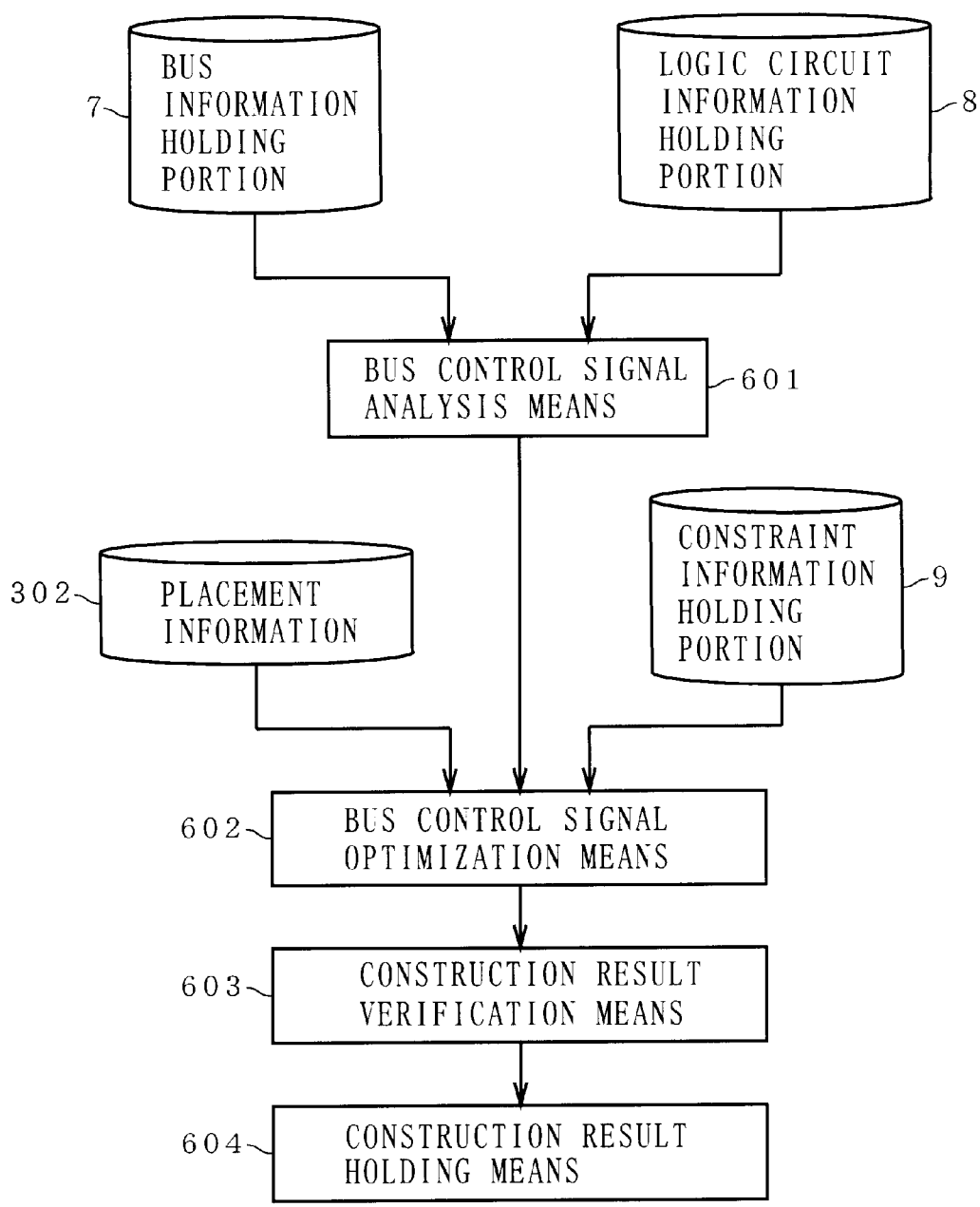
FIG. 12 is a block diagram of bus control signal construction means.

FIG. 12 is a block diagram of the bus control signal construction means 13. Referring to FIG. 12, bus control signal analysis means 601 analyzes the relationship between the cells which input/output information to/from the signal lines and the bus control signal, based on the bus information held in the bus information holding portion 7 and the logic circuit information held in the logic circuit information holding portion 8.

Bus control signal optimization means 602 optimizes the process for distributing the bus control signal, based on the placement information 302 and the constraint information held in the constraint information holding portion 9. The optimization referred to herein means optimization for the logic circuit information, and in some cases additionally has the function of constructing a placement optimization position.

Construction result verification means 603 verifies whether or not the bus control signal optimized by the bus control signal optimization means 602 satisfies the constraint information (provided through the bus control signal optimization means 602) held in the constraint information holding portion 9.

Construction result holding means 604 holds therein the bus control signal structure constructed by the bus control signal optimization means 602 and verified by the construction result verification means 603.

Figure 13:
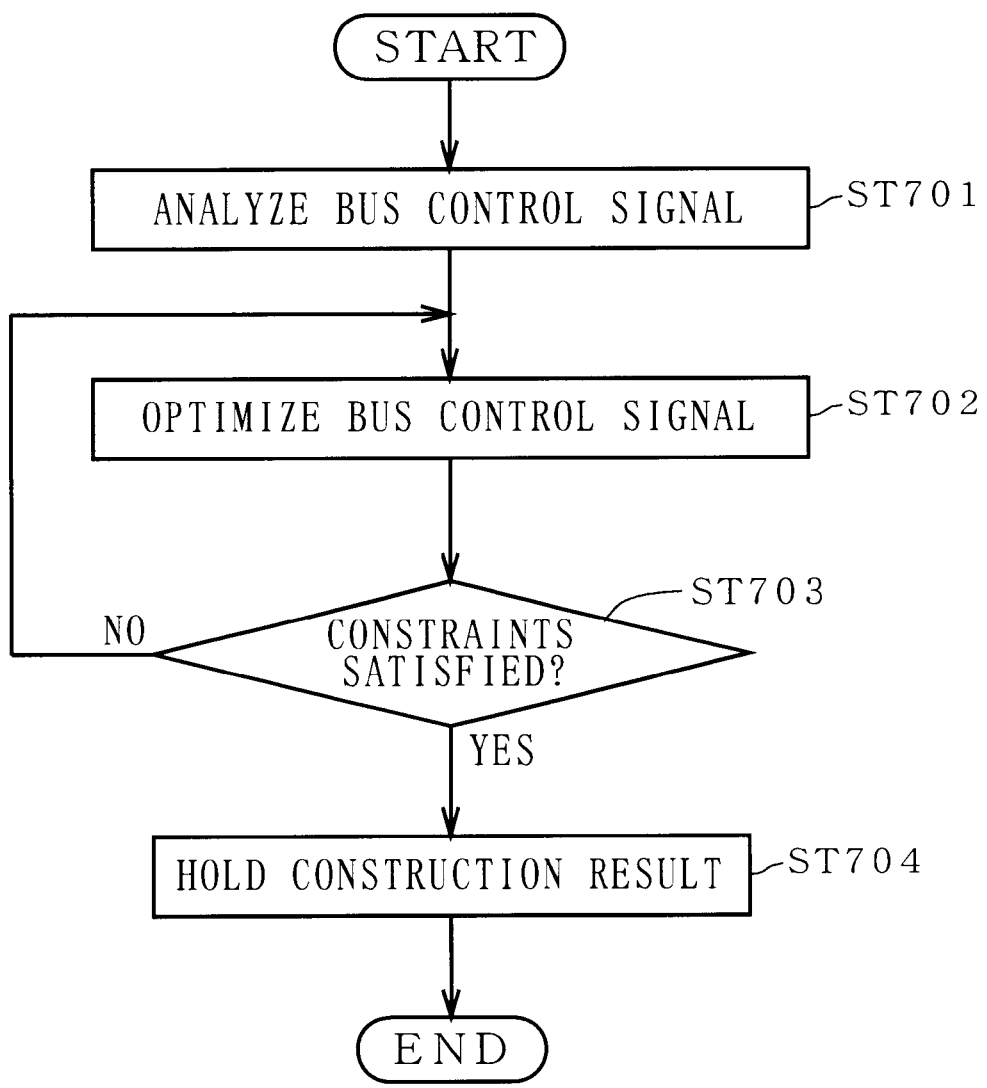
FIG. 13 is a flowchart showing the operation of the bus control signal construction means.

FIG. 13 is a flowchart showing the operation of the bus control signal construction means 13.

With reference to FIG. 13, in the step ST701, the bus control signal analysis means 601 analyzes the relationship between the cells which input/output information to/from the signal lines and the bus control signal, based on the information held in the bus information holding portion 7 and the logic circuit information holding portion 8.

In the step ST702, the bus control signal optimization means 602 optimizes the process for distributing the bus control signal, based on the placement information 302 and the constraint information held in the constraint information holding portion 9.

In the step ST703, the construction result verification means 603 verifies whether or not the bus control signal structure optimized by the bus control signal optimization means 602 satisfies the constraint information held in the constraint information holding portion 9. Then, in the step ST704, the construction result holding means 604 holds therein the bus control signal structure constructed by the bus control signal optimization means 602 and verified by the construction result verification means 603.

Figure 14:
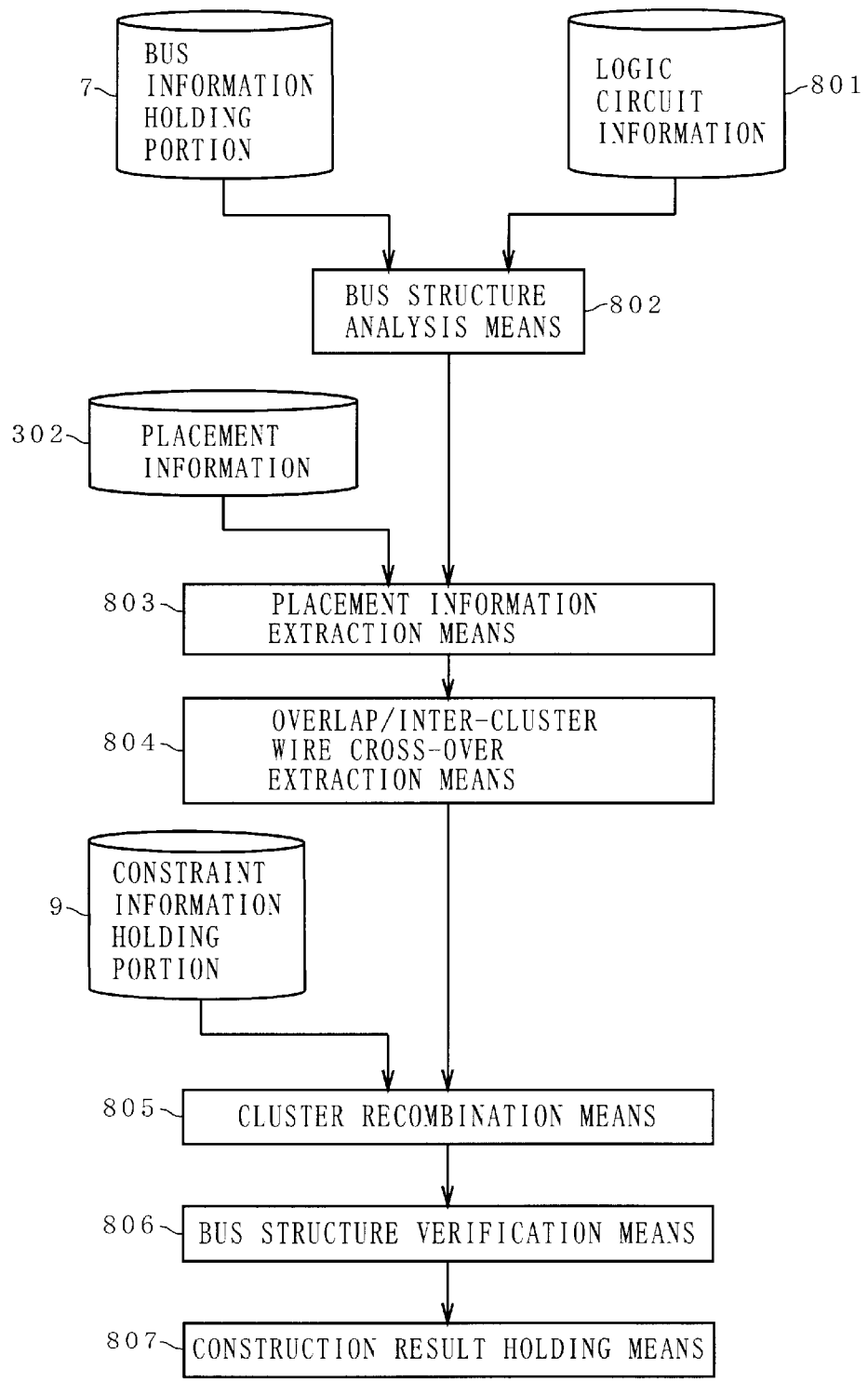
FIG. 14 is a block diagram of the bus structure reconstruction means.

FIG. 14 is a block diagram of the bus structure reconstruction means 14. In FIG. 14, logic circuit information 801 means the logic circuit information held in the logic circuit information holding portion 8 when the bus structure information specifying the bus structure is included in the logic circuit information 2, and means the bus structure construction result (logic circuit information) held in the construction result holding means 306 of the bus structure construction means 12 when the bus structure is constructed for the first time by the processing of the bus structure construction means 12. It should be noted that the bus structure information included in the logic circuit information 2 contains information corresponding to the clusters.

Bus structure analysis means 802 analyzes the hierarchical structure of the cells which input/output information to/from the signal lines, based on the bus information held in the bus information holding portion 7 and the logic circuit information 801.

Placement information extraction means 803 extracts placement information associated with the bus structure from the placement information 302, based on the analysis result from the bus structure analysis means 802.

Based on the placement information extracted by the placement information extraction means 803, overlap/inter-cluster wire cross-over extraction means 804 extracts overlap of cluster regions between different clusters of the same class, and extracts wire cross-over between different clusters of the same class after prediction of the wire paths.

Cluster recombination means 805 recombines clusters so as to eliminate the overlap and wire cross-over, based on the result of extraction of the overlap/inter-cluster wire cross-over extraction means 804 and the constraint information held in the constraint information holding portion 9.

Bus structure verification means 806 verifies whether or not the bus structure recombined by the cluster recombination means 805 is correct in terms of a logic circuit and satisfies the constraint information (provided through the cluster recombination means 805) held in the constraint information holding portion 9.

Reconstruction result holding means 807 holds therein the bus structure subjected to the cluster recombination by the cluster recombination means 805 and verified by the bus structure verification means 806.

Figure 15:
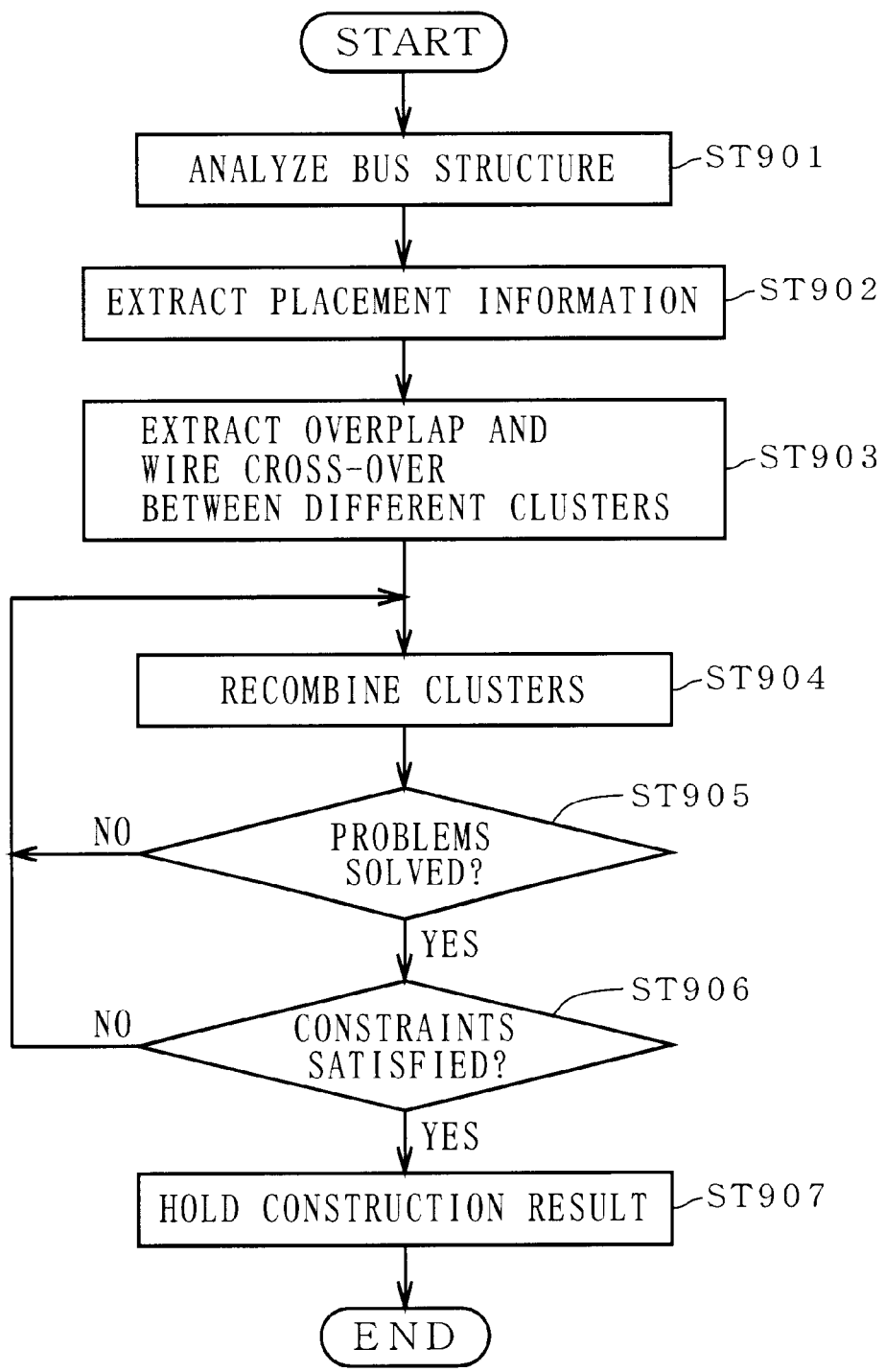
FIG. 15 is a flowchart showing the operation of the bus structure reconstruction means.

FIG. 15 is a flowchart showing the operation of the bus structure reconstruction means 14 shown in FIG. 14.

With reference to FIG. 15, in the step ST901, the bus structure analysis means 802 analyzes the hierarchical structure of the cells which input/output information to/from the signal lines, based on the bus information held in the bus information holding portion 7 and the logic circuit information 801.

In the step ST902, the placement information extraction means 803 associates the cells specified by the placement information 302 with the cells which input/output information to/from the signal lines to extract the placement information associated with the bus structure, based on the analysis result from the bus structure analysis means 802.

Thereafter, in the step ST903, the overlap/inter-cluster wire cross-over extraction means 804 extracts overlap and wire cross-over between different clusters of the same class, based on the placement information extracted by the placement information extraction means 803.

Figure 16:
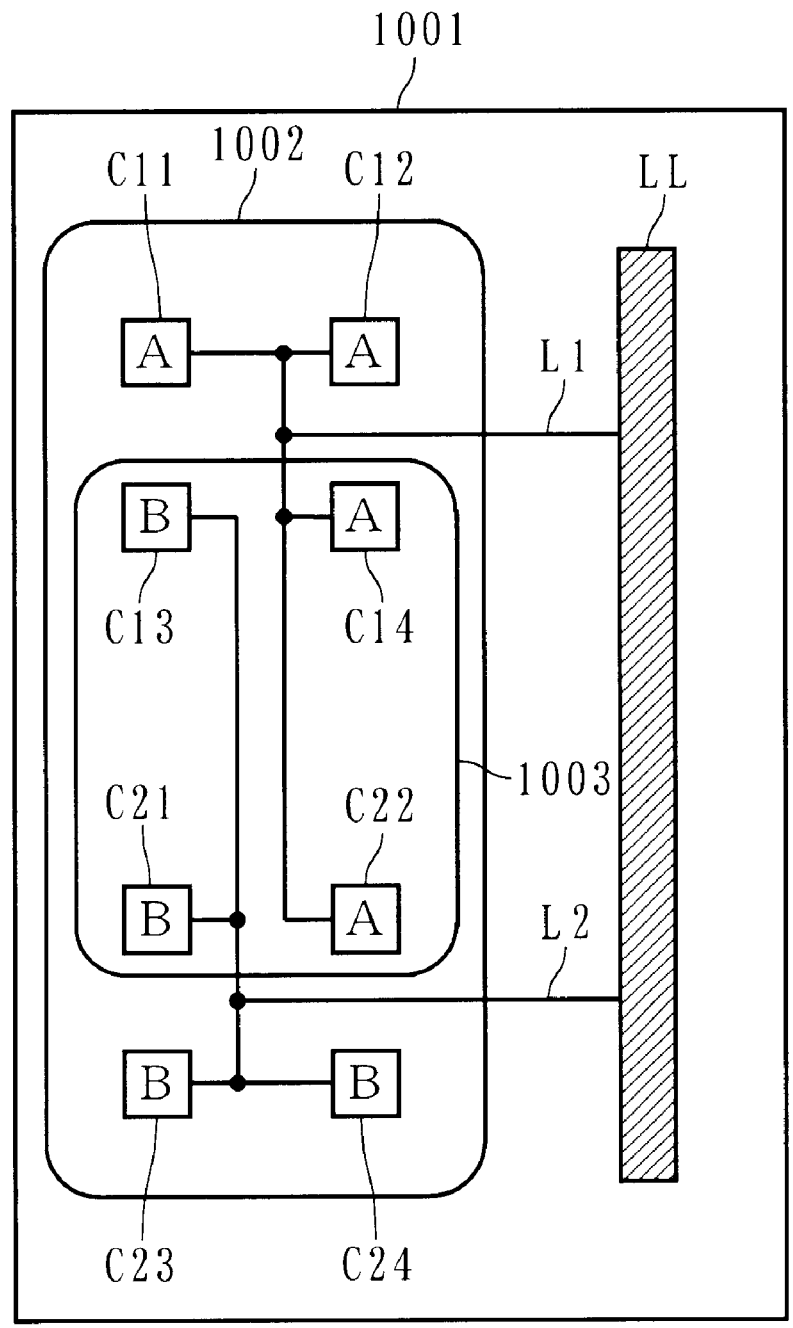

As shown in FIG. 16, for example, there are a cluster 1002 having cells C11, C12, C23 and C24, and a cluster 1003 of the same class as the cluster 1002 and having cells C13, C14, C21 and C22. The cells C11, C12, C14 and C22 are connected to each other through a wire L1, and the cells C13, C21, C23 and C24 are connected to each other through a wire L2, with the wires L1 and L2 connected to a trunk wire LL. Extracted in this case are the overlap in a region including the cells C13, C14, C21 and C22 between the clusters 1002 and 1003, and the cross-over of the wires L1 and L2 between the clusters 1002 and 1003.

In the step ST904, the clusters are recombined so that the overlap and wire cross-over extracted in the step ST903 are eliminated. The processing in the step ST904 is continued until the problems of the overlap and wire cross-over are recognized as having been solved in the step ST905.

The cluster recombination for eliminating the overlap of the clusters 1002 and 1003 in the circuit shown in FIG. 16 and the cross-over of the wires L1 and L2 between the clusters 1002 and 1003 creates a cluster comprised of the cells C11 to C14 and a cluster comprised of the cells C21 to C24. Further, the cells C13 and C23 are swapped for each other. The final result of the cluster recombination is a cluster 1007 having the cells C11, C12, C22 and C14 connected to a wire L3, and a cluster 1008 having the cells C21, C13, C23 and C24 connected to a wire L4, as shown in FIG. 17.

Figure 17:
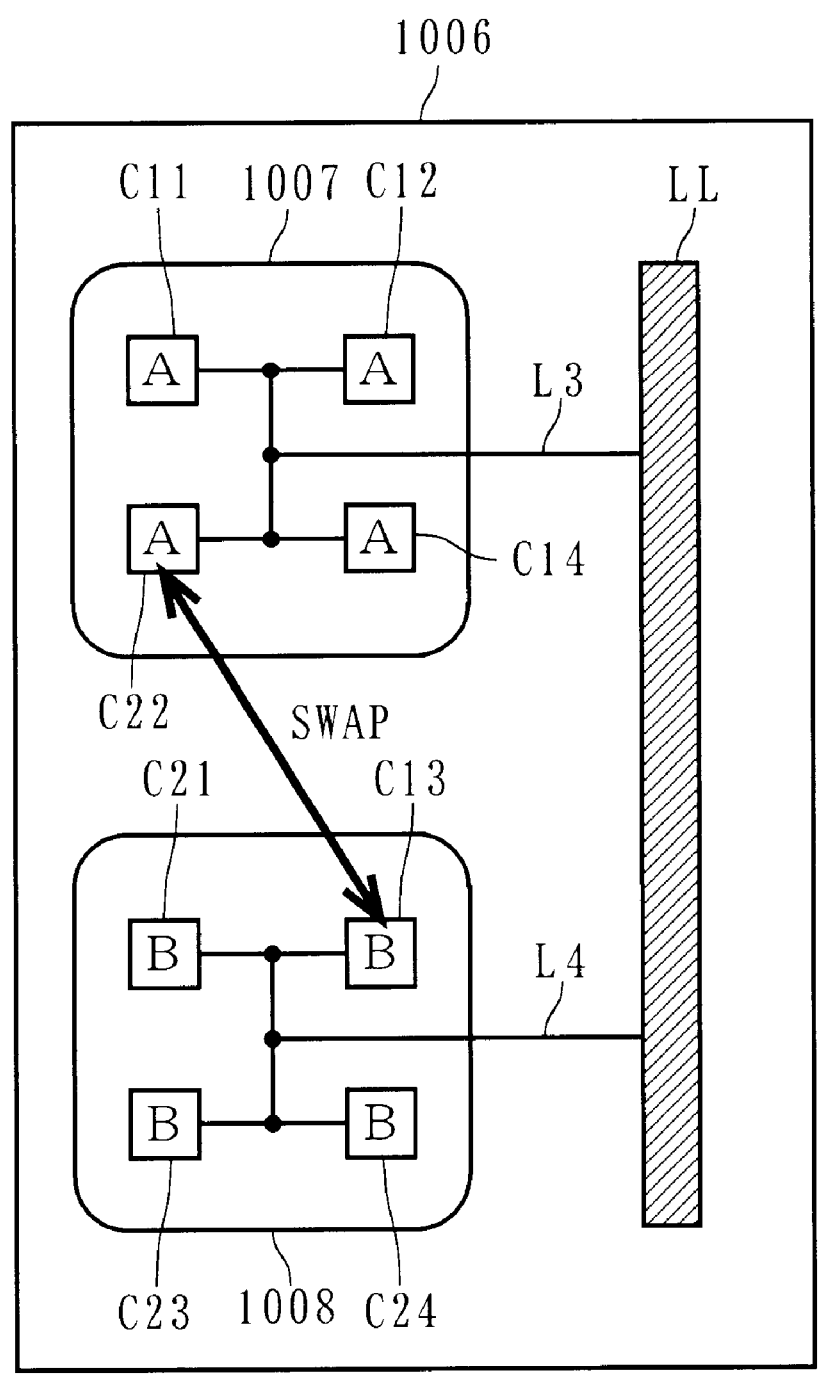
FIG. 17 is a circuit diagram for illustrating the operation of the cluster recombination means.

The cluster overlap and wire cross-over are eliminated in a cluster-recombined circuit 1006 shown in FIG. 17 without any modification of the logic contents of the circuit 1001 which has not been cluster-recombined. Then, it is recognized in the step ST905 that the problems are solved (YES).

In the step ST906, the bus structure verification means 806 verifies whether or not the resultant bus structure is inconsistent with the constraint information held in the constraint information holding portion 9. If the bus structure satisfies the constraint information (YES), the flow proceeds to the step ST907. If the bus structure does not satisfy the constraint information (NO), the flow returns to the step ST904 for one more recombination of clusters.

On the other hand, if the bus structure satisfies the constraint information in the step ST906, the reconstruction result holding means 807 holds therein the bus structure reconstruction result in the step ST907.

In the first preferred embodiment, as above described, the bus structure construction means 12, the bus control signal construction means 13 and the bus structure reconstruction means 14 may automatically construct the bus structure which reflects the cell placement information, after the placement of the cells constituting the logic circuit based on the bus information, the logic circuit information and the constraint information. After the bus structure is constructed, the placement of the cells only in the modified part, the execution of the actual placement and routing by means of the global routing and the detail routing, and the verification of the placement and routing are carried out, and then the placement and routing result is automatically outputted.

Therefore, the bus structure is constructed based on the actual layout (cell placement) to achieve optimum solutions. The optimum solutions referred to herein mean the provision of characteristics including: (1) no redundant routing, (2) good timing performance, (3) low power consumption, (4) low skew, (5) low noise, (6) low voltage drop, and the like.

<Second Preferred Embodiment>

Figure 18:
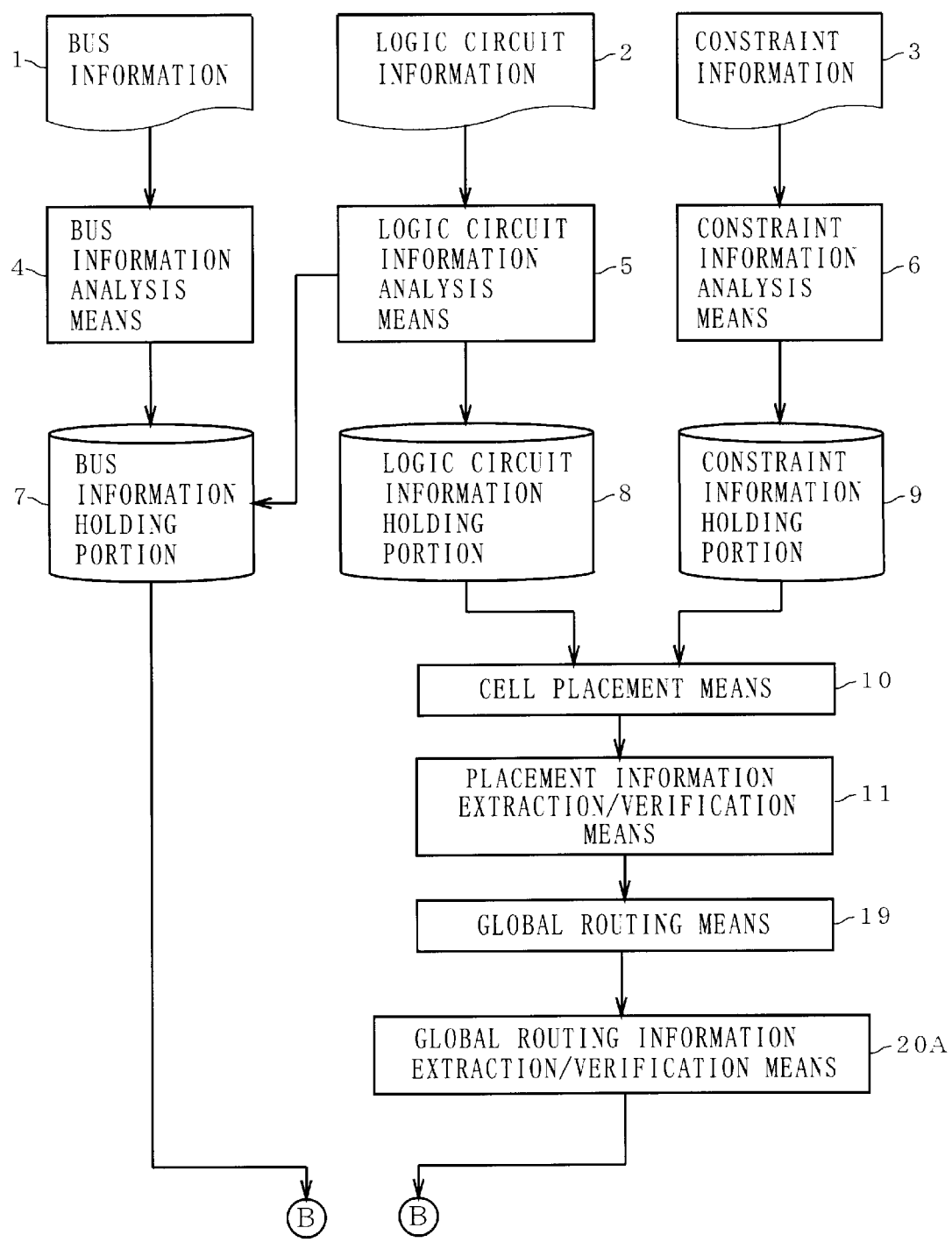
FIGS. 18 and 19 are block diagrams of the automatic placement and routing device according to a second preferred embodiment of the present invention.
Figure 19:
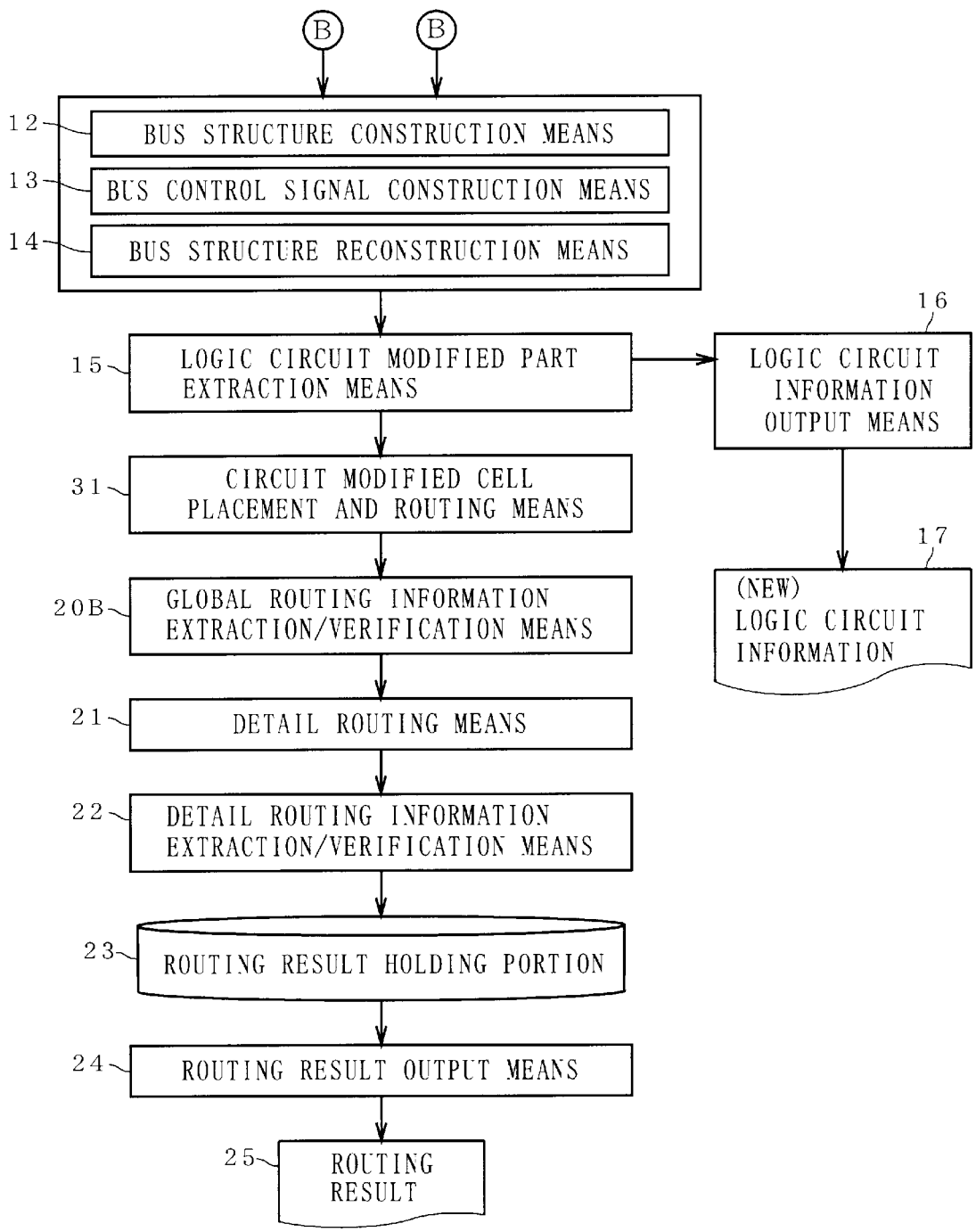

FIGS. 18 and 19 are block diagrams of the automatic placement and routing device according to a second preferred embodiment of the present invention. As shown in FIGS. 18 and 19, the bus information 1, the logic circuit information 2 and the constraint information 3 to the placement information extraction/verification means 11 are similar in construction to those of the first preferred embodiment shown in FIGS. 1 and 2. Thus, like reference numerals and characters are used to designate elements identical with those of FIGS. 1 and 2, and the description thereof will be omitted as necessary.

After the placement information extraction/verification means 11 extracts and verifies the cell placement information, the global routing means 19 performs the global routing based on the cell placement information, and global routing information extraction/verification means 20A extracts and verifies the global routing result.

The bus structure construction means 12, the bus control signal construction means 13, and the bus structure reconstruction means 14 construct (reconstruct) the bus structure and the bus control signal, based on the global routing result from the global routing information extraction/verification means 20A in addition to the constraint information provided from the constraint information holding portion 9 through the means 10, 11, 19 and 20A, the logic circuit information provided from the logic circuit information holding portion 8 through the means 10, 11, 19 and 20A, and the bus information held in the bus information holding portion 7. The contents of processing in the bus structure construction means 12, the bus control signal construction means 13 and the bus structure reconstruction means 14 are similar to those in the means 12 to 14 of the first preferred embodiment except that the global routing result is additionally taken into consideration.

The logic circuit modified part extraction means 15 extracts a part of the logic circuit which is required to be modified as a result of the bus structure constructed or modified by the bus structure construction means 12, the bus control signal construction means 13 and the bus structure reconstruction means 14.

The logic circuit information output means 16 outputs the visually recognizable logic circuit information 17 which specifies the modified logic circuit, based on the logic circuit modified result extracted by the logic circuit modified part extraction means 15.

Circuit modified cell placement and routing means 31 outputs modified cell routing information provided by placing the cells in the modified part extracted by the logic circuit modified part extraction means 15 and by performing again the global routing on the global routing portion of the modified part. The functions of the circuit modified cell placement and routing means 31 are sometimes replaced with those of the cell placement means 10 and the global routing means 19.

Global routing information extraction/verification means 20B extracts (holds) and verifies a global routing result including together the global routing result (provided through the means 12 to 15, and 31) extracted by the global routing information extraction/verification means 20A and the modified cell routing information. If the processing in the circuit modified cell placement and routing means 31 provides the entire global routing result including the modified part, the global routing information extraction/verification means 20B may perform completely the same operation as the global routing information extraction/verification means 20A to extract and verify the modified global routing result.

The detail routing means 21 to the routing result 25 of the second preferred embodiment are similar in construction and operation to those of the first preferred embodiment shown in FIGS. 1 and 2. Thus, like reference numerals and characters are used to designates elements identical with those of FIGS. 1 and 2, and the description thereof will be omitted as necessary.

The automatic placement and routing device of the second preferred embodiment constructed as above described, of course, provides effects similar to those of the first preferred embodiment. Further, the automatic placement and routing device of the second preferred embodiment performs the cell placement and the global routing based on the bus information, the logic circuit information and the constraint information, and thereafter constructs the bus structure in consideration for the cell placement information and the global routing result. Therefore, the second preferred embodiment takes into consideration the global routing closer to the final layout for construction of the bus structure, thereby to further provide the effect of constructing the bus structure more conforming to the final result than does the first preferred embodiment.

<Third Preferred Embodiment>

Figure 20:
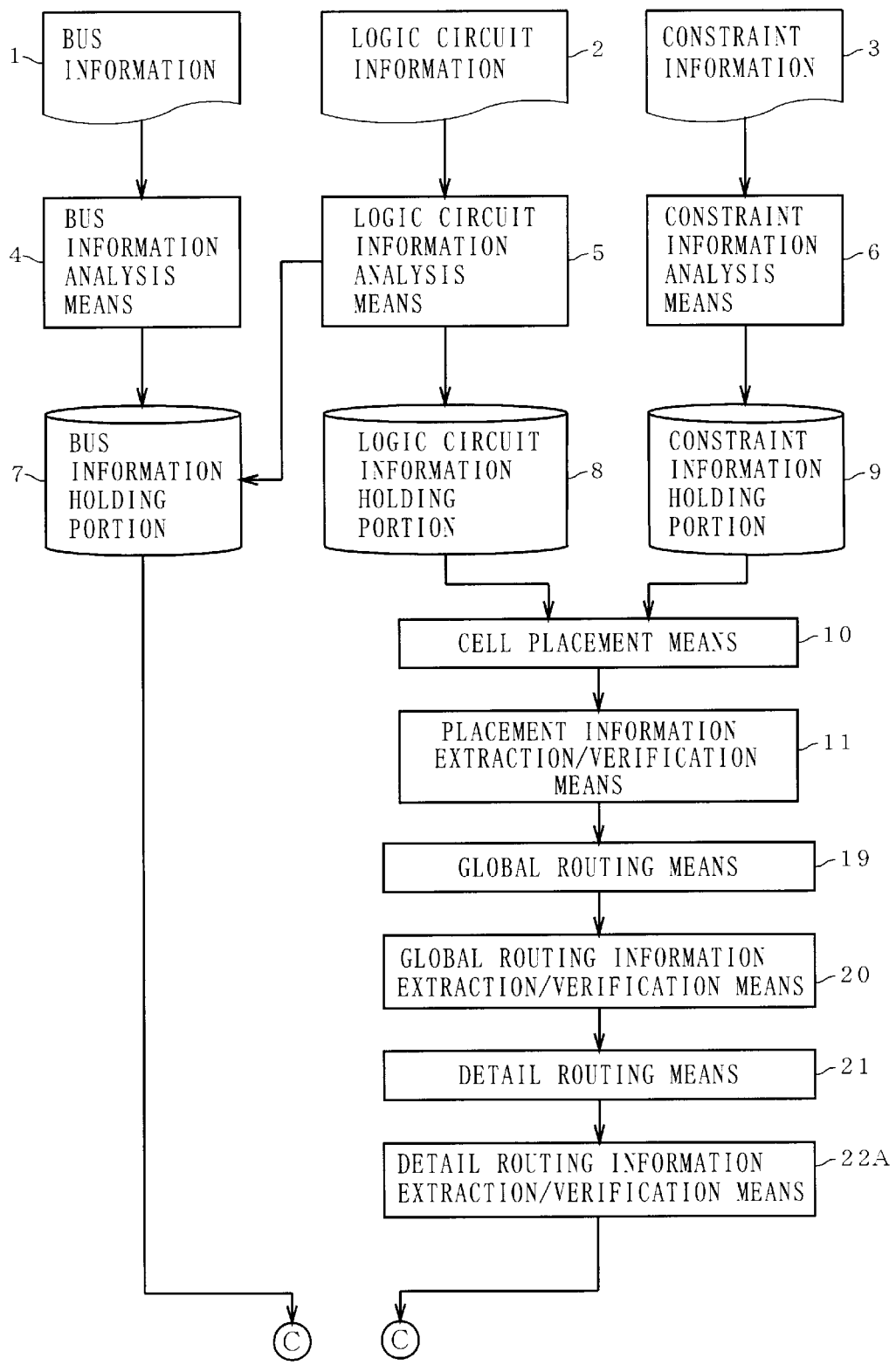
FIGS. 20 and 21 are block diagrams of the automatic placement and routing device according to a third preferred embodiment of the present invention.
Figure 21:
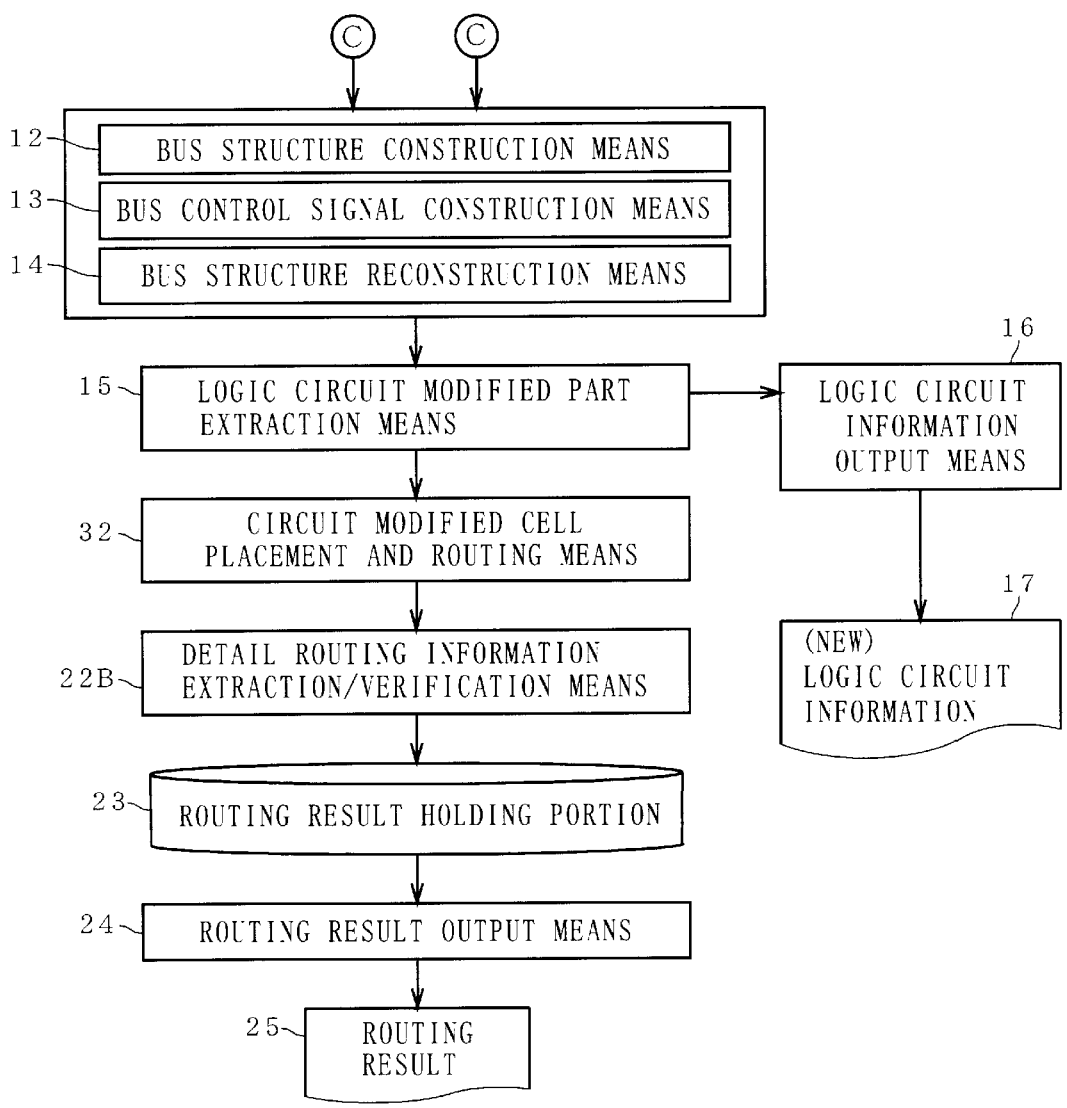

FIGS. 20 and 21 are block diagrams of the automatic placement and routing device according to a third preferred embodiment of the present invention. As shown in FIGS. 20 and 21, the bus information 1, the logic circuit information 2 and the constraint information 3 to the placement information extraction/verification means 11 are similar in construction to those of the first preferred embodiment shown in FIGS. 1 and 2.

After the placement information extraction/verification means 11 extracts and verifies the placement information, the global routing means 19 performs the global routing, and the global routing information extraction/verification means 20 extracts and verifies the global routing result.

The detail routing means 21 performs the detail routing in consideration for the layout of the wires for interconnecting the inputs and outputs of the cells, based on the global routing result extracted from the global routing information extraction/verification means 20. Detail routing information extraction/verification means 22A extracts and verifies the detail routing result.

The bus structure construction means 12, the bus control signal construction means 13, and the bus structure reconstruction means 14 construct (reconstruct) the bus structure and the bus control signal, based on the detail routing result from the detail routing information extraction/verification means 22A in addition to the constraint information provided from the constraint information holding portion 9 through the means 10, 11, 19 to 21, and 22A, the logic circuit information provided from the logic circuit information holding portion 8 through the means 10, 11, 19 to 21, and 22A, and the bus information held in the bus information holding portion 7. The contents of processing in the bus structure construction means 12, the bus control signal construction means 13 and the bus structure reconstruction means 14 are similar to those in the means 12 to 14 of the first preferred embodiment except that the detail routing result is additionally taken into consideration.

The logic circuit modified part extraction means 15 extracts a part of the logic circuit which is required to be modified as a result of the bus structure constructed or modified by the bus structure construction means 12, the bus control signal construction means 13 and the bus structure reconstruction means 14.

The logic circuit information output means 16 outputs the visually recognizable logic circuit information 17 which specifies the modified logic circuit, based on the logic circuit modified result extracted by the logic circuit modified part extraction means 15.

Circuit modified cell placement and routing means 32 outputs the modified cell routing information provided by placing the cells in the modified part extracted by the logic circuit modified part extraction means 15 and by performing again the detail routing on the detail routing portion of the modified part, thereby establishing the routing. The functions of the circuit modified cell placement and routing means 32 are sometimes replaced with those of the cell placement means 10, the global routing means 19, and the detail routing means 21.

Detail routing information extraction/verification means 22B extracts (holds) and verifies a detail routing result including together the detail routing result (provided through the means 12 to 15, and 32) extracted by the detail routing information extraction/verification means 22A and the modified cell routing information. If the processing in the circuit modified cell placement and routing means 32 provides the entire detail routing result including the modified part, the detail routing information extraction/verification means 22B may perform completely the same operation as the detail routing information extraction/verification means 22A to extract and verify the modified detail routing result.

The routing result holding portion 23 to the routing result 25 of the third preferred embodiment are similar in construction and operation to those of the first preferred embodiment shown in FIGS. 1 and 2. Thus, like reference numerals and characters are used to designates elements identical with those of FIGS. 1 and 2, and the description thereof will be omitted as necessary.

The automatic placement and routing device of the third preferred embodiment constructed as above described, of course, provides effects similar to those of the first preferred embodiment. Further, the automatic placement and routing device of the third preferred embodiment performs the cell placement, the global routing and the detail routing based on the bus information, the logic circuit information and the constraint information, and thereafter constructs the bus structure in consideration for the cell placement information and the detail routing result. Therefore, the third preferred embodiment takes into consideration the detail routing which is the final layout for construction of the bus structure, thereby to further provide the effect of constructing the bus structure more conforming to the final result than does, of course, the first preferred embodiment and does also the second preferred embodiment.

<Fourth Preferred Embodiment>

Figure 22:
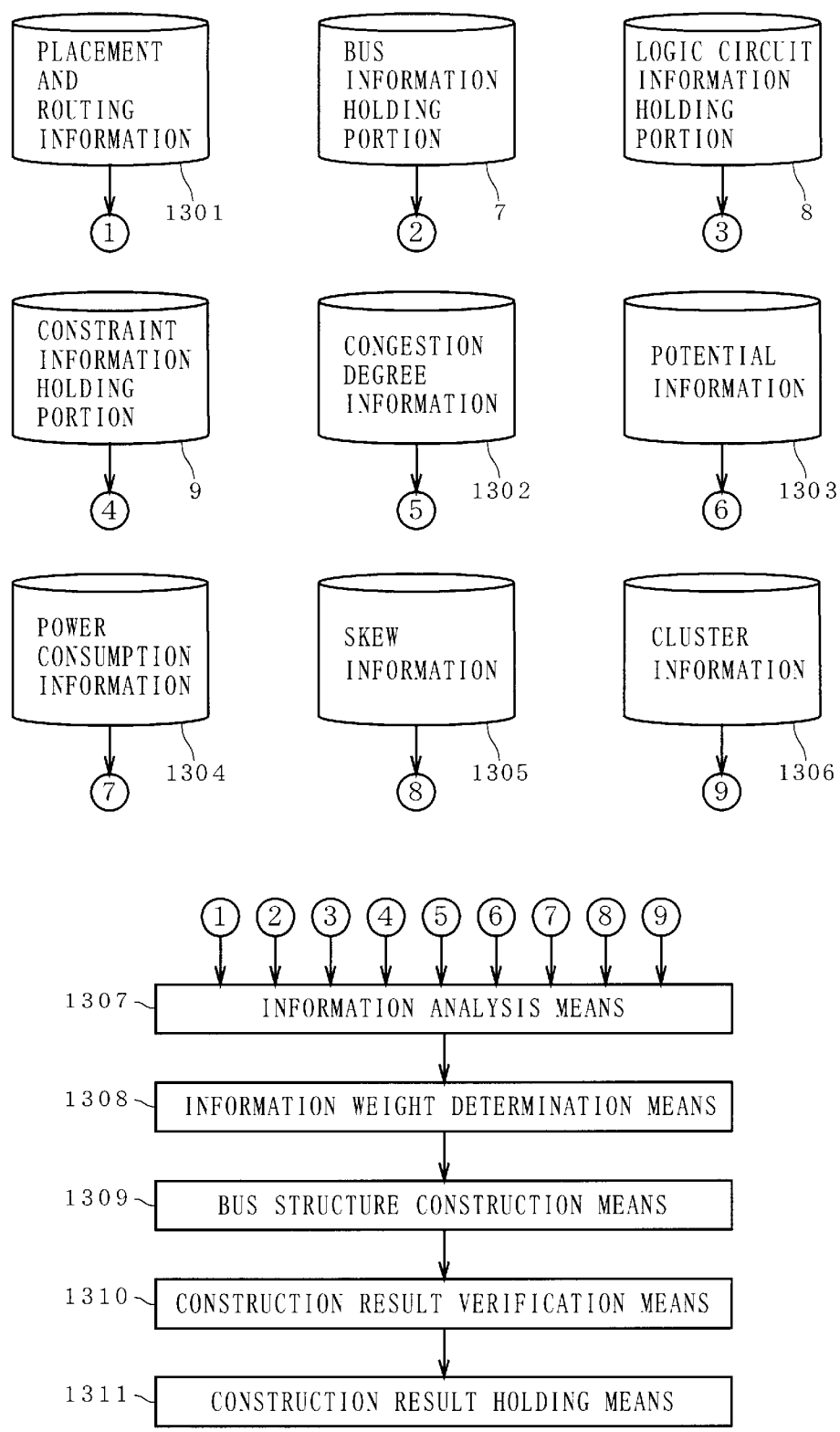
FIG. 22 is a block diagram of the automatic placement and routing device according to a fourth preferred embodiment of the present invention.

FIG. 22 is a partial block diagram of the automatic placement and routing device according to a fourth preferred embodiment of the present invention. There are shown in FIG. 22 elements corresponding to the bus structure construction means 12, the bus control signal construction means 13 and the bus structure reconstruction means 14 of the first preferred embodiment shown in FIGS. 1 and 2, the second preferred embodiment shown in FIGS. 18 and 19, and the third preferred embodiment shown in FIGS. 20 and 21. Thus, other than the elements of FIG. 22 of the fourth preferred embodiment may employ those of any one of the first, second and third preferred embodiments.

Referring to FIG. 22, all or at least one of nine items of judgement information to be described below is provided to information analysis means 1307. The nine items of judgement information are as follows: placement and routing information 1301; the bus information held in the bus information holding portion 7; the logic circuit information held in the logic circuit information holding portion 8; the constraint information (including constraint information pertaining to timing, constraint information pertaining to crosstalk, priority weight information which specifies the priority of the judgement information, and the like) held in the constraint information holding portion 9; congestion degree information 1302; potential information 1303; power consumption information 1304; skew information 1305; and cluster information 1306.

The placement and routing information 1301 includes information extracted by the placement information extraction/verification means 11, the global routing information extraction/verification means 20 (20A), or the detail routing information extraction/verification means 22 (22A).

The congestion degree information 1302, the potential information 1303, the power consumption information 1304, the skew information 1305, and the cluster information 1306 are information extracted by a device included in the placement and routing device or an external purpose-built device. The congestion degree information 1302 includes information about the actual or predicted degree of congestion of the placement and routing. The potential information 1303 includes information about the potentials at different nodes or some typical nodes versus a plurality of or a single state and time. The power consumption information 1304 includes information about statically or dynamically analyzed power consumption. The skew information 1305 includes information about the signal skew of signals and clocks propagating through the signal lines, that is, the nets wherein a transmission time difference becomes a problem. The cluster information 1306 includes information about clusters extracted as a result of the analysis of the bus structure, with information about a plurality of or a single cluster configuration, such as a rectangle, an ellipse and a polygon, provided for each cluster.

The information analysis means 1307 may be comprised of a single device or a combination of a plurality of devices associated with respective pieces of information. The information analysis means 1307 analyzes the inputted items of judgement information to output analysis results (conditions indicative of the items of judgement information) to information weight determination means 1308.

The information weight determination means 1308 receives the analysis results from the information analysis means 1307 to determine which one of the analysis results of the respective items of judgement information is given a high priority for construction of the bus structure, based on the constraint information (provided through the information analysis means 1307) held in the constraint information holding portion 9, thereby recognizing the priority weight information. The information weight determination means 1308 then outputs the analysis results of the respective items of judgement information and the priority weight information to bus structure construction means 1309.

The bus structure construction means 1309 constructs (reconstructs) the bus structure and the structure of the bus control signal so that the conditions indicated by the respective items of judgement information are satisfied in accordance with the weight indicated by the priority weight information.

For example, if the power consumption information 1304 indicates that the power consumption is reduced to a predetermined value or less, the bus structure construction means 1309 constructs the bus structure while reducing the power consumption so that the above condition is satisfied. One of the methods of constructing the bus structure which reduces the power consumption includes, for example, constructing the bus control signal which performs control so that a buffer between the clusters does not operate when the data transfer within a cluster is recognized based on inter-bus data transfer information included in the bus information held in the bus information holding portion 7.

Construction result verification means 1310 verifies the bus structure and bus control signal construction results which are constructed by the bus structure construction means 1309. The construction result verification means 1310 corresponds to the bus structure verification means 305 of FIG. 6 and the construction result verification means 603 of FIG. 12.

Construction result holding means 1311 holds therein the bus structure and bus control signal construction results verified by the construction result verification means 1310. The construction result holding means 1311 corresponds to the construction result holding means 306 of FIG. 6 and the construction result holding means 604 of FIG. 12.

Figure 23:
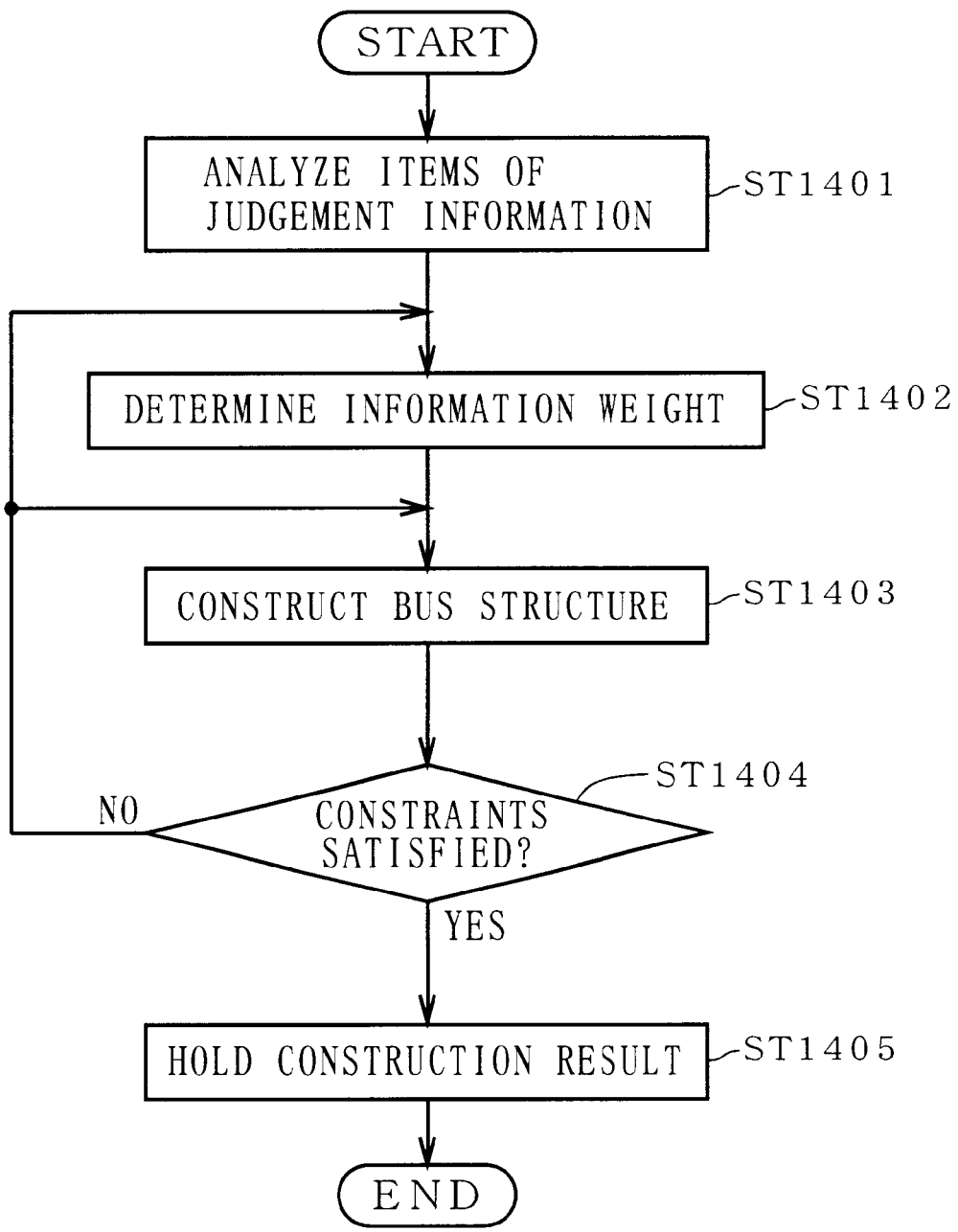
FIG. 23 is a flowchart showing the operation of the automatic placement and routing device of the fourth preferred embodiment.

FIG. 23 is a flowchart showing the operation of the elements of the fourth preferred embodiment shown in FIG. 22.

Referring to FIG. 23, the information analysis means 1307 analyzes the items of judgement information (step ST1401). Next, the information weight determination means 1308 determines the priority weight of each of the items of judgement information (step ST1402) to output the priority weight information.

Then, the bus structure construction means 1309 constructs the bus structure and the bus control signal structure in consideration for the analysis results of the respective items of judgement information in accordance with the priority weight indicated by the priority weight information provided from the information weight determination means 1308 (step ST1403).

The construction result verification means 1310 verifies the construction results of the bus structure and the bus control signal structure, based on the constraint information held in the constraint information holding portion 9 (step ST1404). If it is judged in the step ST1404 that the constraints are satisfied (YES), the construction result holding means 1311 holds therein the construction results (step ST1405).

On the other hand, it is judged in the step S1404 that the constraints are not satisfied (NO), the flow returns to the step ST1402 or the step ST1403, and the information weight determination processing (step ST1402) or the bus structure construction processing (step ST1403) is carried out again.

As described hereinabove, the automatic placement and routing device of the fourth preferred embodiment can construct the bus structure based on more information. This allows the construction of the bus structure which meets various requirements and conforms to practical levels.

Additionally, the bus structure construction means 1309 takes into consideration the analysis results of the respective items of judgement information to construct the bus structure in accordance with the weight indicated by the priority weight information determined by the information weight determination means 1308. Therefore, the bus structure conforming to more practical levels may be constructed.

<Fifth Preferred Embodiment>

Figure 24:
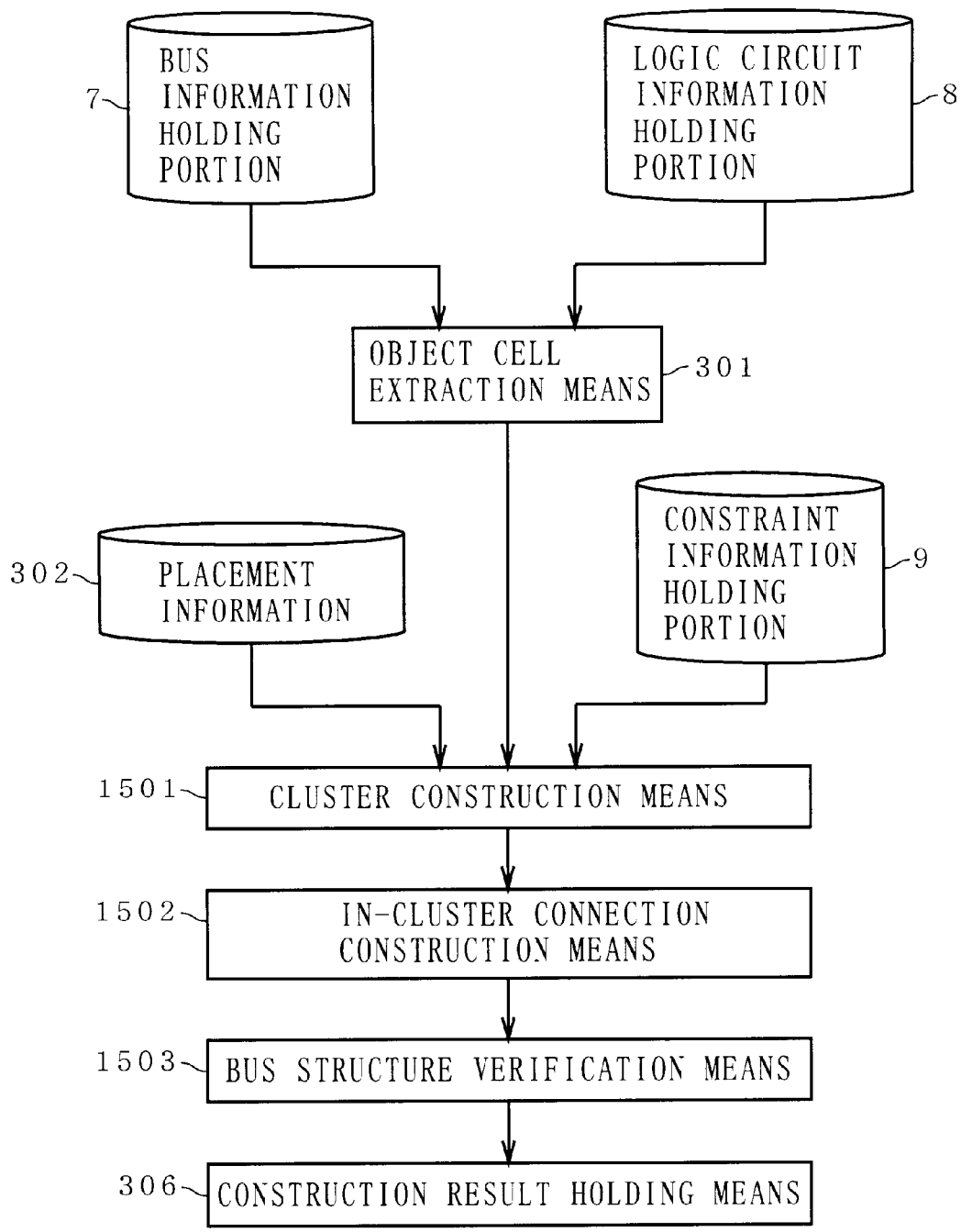
FIG. 24 is a partial block diagram of the automatic placement and routing device according to a fifth preferred embodiment of the present invention.

FIG. 24 is a block diagram of the bus structure construction means of the automatic placement and routing device according to a fifth preferred embodiment of the present invention. Other than the bus structure construction means of the fifth preferred embodiment may employ that of any one of the first to fourth preferred embodiments.

The fifth preferred embodiment relates to bus construction in the case where a trunk wire connected to a plurality of wires is routed in an LSI circuit.

Referring to FIG. 24, the placement information 302 is the cell placement information provided from the placement information extraction/verification means 11. The logic circuit specified by the logic information held in the logic circuit information holding portion 8 shall have a flat bus structure.

The object cell extraction means 301 extracts object cells that transfer data to and from the signal lines, based on the bus information held in the bus information holding portion 7 and the logic circuit information held in the logic circuit information holding portion 8.

Cluster construction means 1501 constructs a trunk wire and constructs clusters, with the constraint information held in the constraint information holding portion 9 being satisfied, based on the cell placement information 302 and the extracted cell information extracted by the object cell extraction means 301. The clusters are constructed so that cells placed adjacent to each other basically constitute the same cluster.

In-cluster connection construction means 1502 constructs the signal lines for connecting the cells in the clusters constructed by the cluster construction means 1501 to construct a bus structure. At this time, a buffer is inserted as required into signal lines.

Bus structure verification means 1503 verifies whether or not the bus structure constructed by the in-cluster connection construction means 1502 is correct in terms of a logic circuit and satisfies the constraint information held in the constraint information holding portion 9.

The construction result holding means 306 holds therein the bus structure constructed by the in-cluster connection construction means 1502 and verified by the bus structure verification means 1503.

Figure 25:
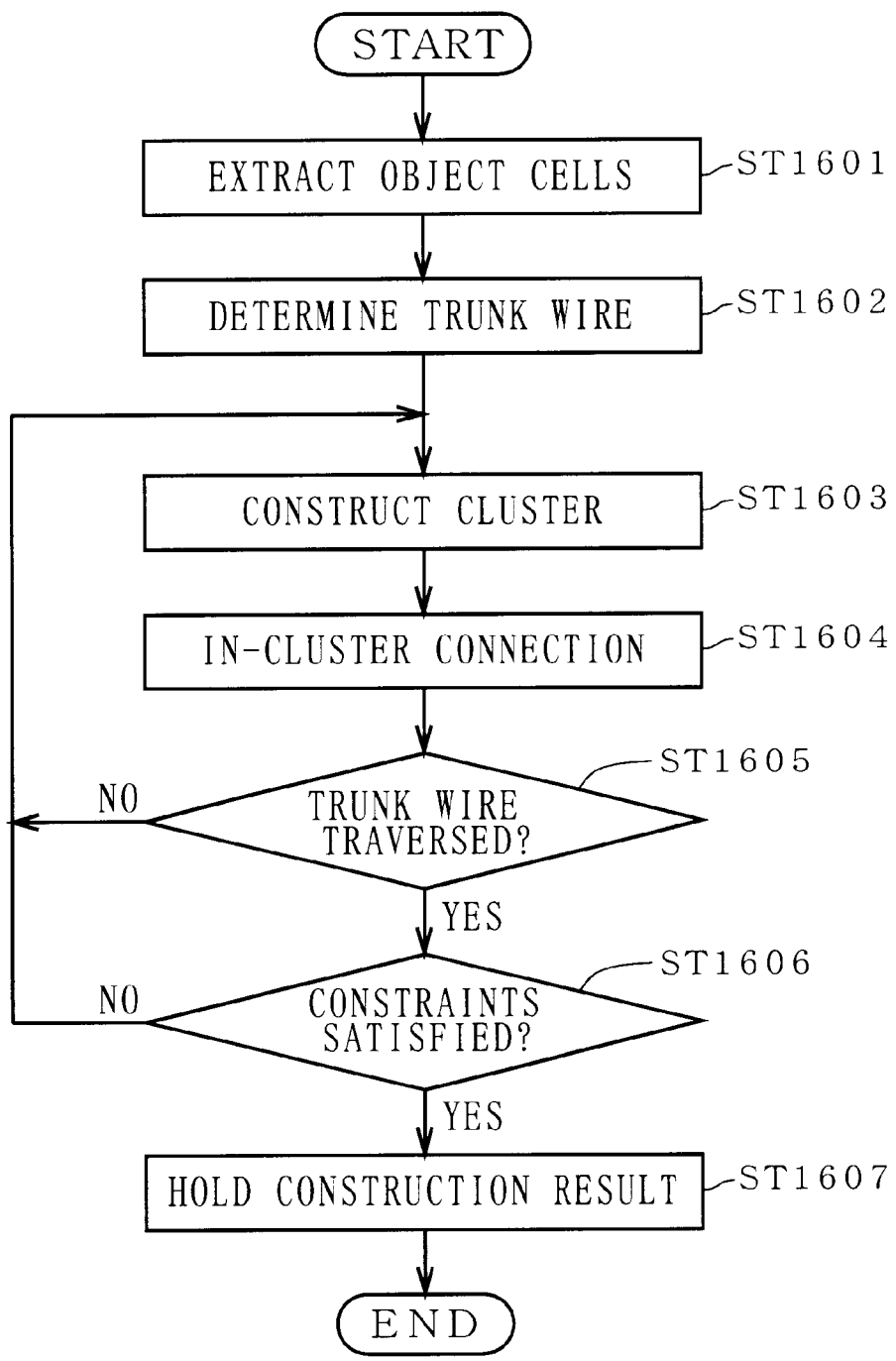
FIG. 25 is a flowchart showing the operation of the automatic placement and routing device of the fifth preferred embodiment.
Figure 26:
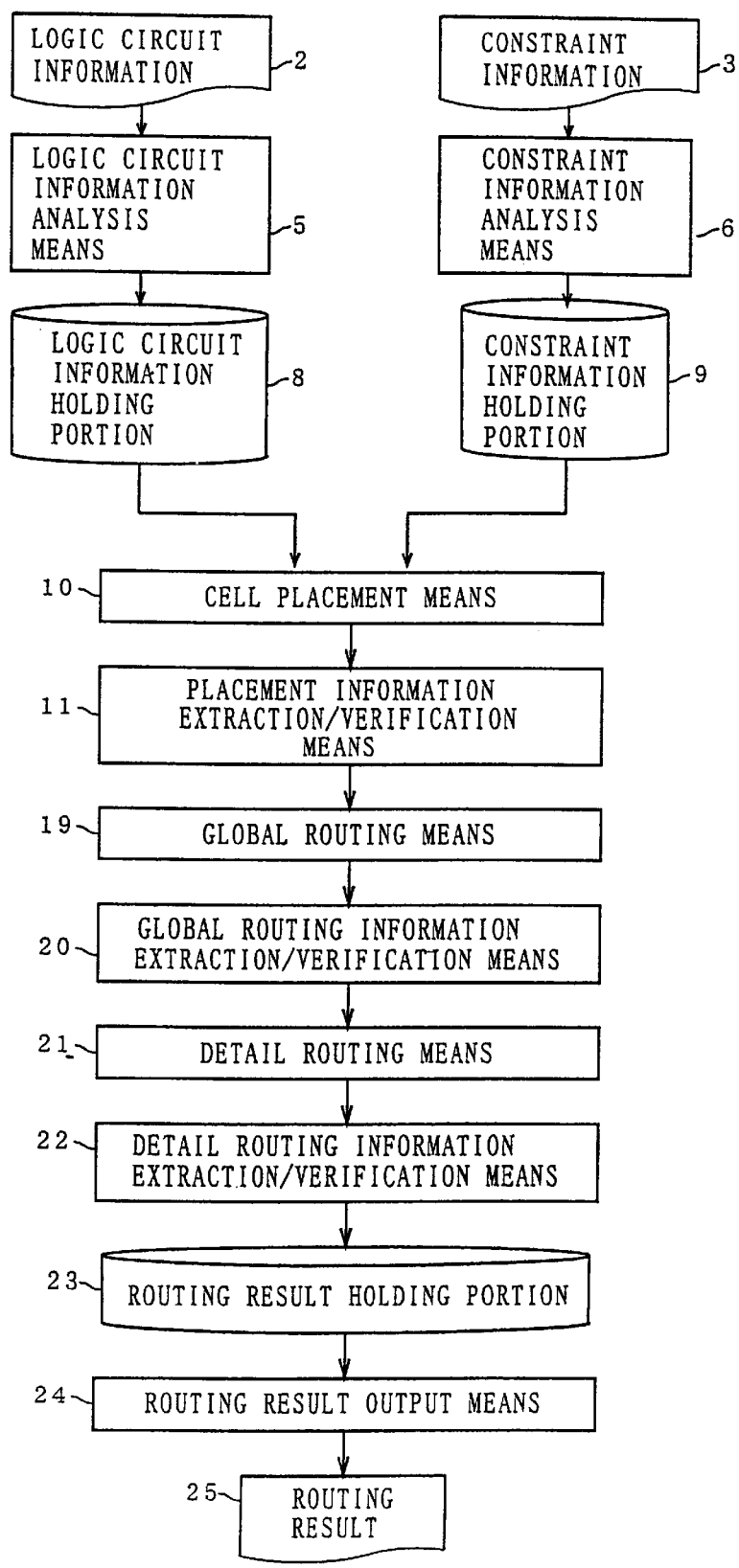
FIG. 26 is a block diagram of a conventional automatic placement and routing device.

FIG. 25 is a flowchart showing the operation of the bus structure construction means of the fifth preferred embodiment.

Referring to FIG. 25, the object cell extraction means 301 extracts the object cells that transfer data to and from the signal lines, based on the information held in the bus information holding portion 7 and the logic circuit information holding portion 8, in the step ST1601.

Then, in the step ST1602, the cluster construction means 1501 constructs the trunk wire based on the placement information 302, the information held in the logic circuit information holding portion 8 and the information held in the constraint information holding portion 9.

In the step ST1603, the cluster construction means 1501 constructs a cluster of one class, based on the placement information 302 and the information held in the logic circuit information holding portion 8.

In the step ST1604, the in-cluster connection construction means 1502 constructs the signal lines for connecting the cells in the cluster constructed in the step ST1603.

In the step ST1605, the bus structure verification means 1503 verifies whether or not the cluster constructed in the step ST1604 traverses the trunk wire (the trunk wire is included in the cluster). If the trunk wire is judged as being traversed in the step ST1605, the trunk wire is connected to the signal lines in the cluster and the flow proceeds to the step ST1606. If the trunk wire is not traversed in the step ST1605, the flow returns to the step ST1603 for prompting for the construction of a cluster of a higher class.

Subsequently, the steps ST1603 to ST1605 are repeated until the trunk wire is judged as being traversed in the step ST1605.

In the step ST1606, the bus construction verification means 1503 verifies whether or not the bus structure is inconsistent with the constraint information held in the constraint information holding portion 9. If the bus structure satisfies the constraint information (YES), the flow proceeds to the step ST1607. If the bus structure does not satisfy the constraint information (NO), the flow returns to the step ST1602 for modification to the construction of the cluster.

On the other hand, if the bus structure satisfies the constraint information in the step ST1606, the construction result holding means 306 holds therein the bus structure construction result in the step ST1607.

As described above, the automatic placement and routing device of the fifth preferred embodiment provides the effect of constructing the bus structure with the trunk wire formed, as well as the effects of the first to fourth preferred embodiments.

While the invention has been described in detail, the foregoing description is in all aspects illustrative and not restrictive. It is understood that numerous other modifications and variations can be devised without departing from the scope of the invention.

We claim:

1. An automatic placement and routing device comprising:
   cell placement information output means for receiving logic circuit information specifying a logic circuit in netlist format, and for outputting cell placement information specifying the placement of cells constituting said logic circuit, based on said logic circuit information;
   bus structure construction result output means for receiving said logic circuit information, said cell placement information, and bus information specifying transfer of signals between said cells on a logical level, and for constructing a bus structure including signal lines for making connection between said cells, based on said logic circuit information, said cell placement information and said bus information, to output a bus construction result; and
   routing establishment means for receiving said bus construction result for establishing routing between said cells, based on said bus construction result,
   wherein said bus structure construction result output means comprises bus structure construction means for providing said signal lines to construct said bus structure, said bus structure construction means comprising:
      cluster construction means for combining a plurality of cells and existing clusters which satisfy a predetermined condition together to construct a new cluster;
      in-cluster connection construction means for constructing signal lines for making connection between cells in said cluster constructed by said cluster construction means; and
      operation control means for causing said cluster construction means and said in-cluster connection construction means to continue their operations until said cluster covers all of the cells constituting said logic circuit,
   wherein said bus information includes information which specifies control of the transfer of signals between cells on a logical level, and said bus structure includes a bus control signal for controlling routing/not routing of each of said signal lines, and
   wherein said bus structure construction result output means further comprises bus control signal construction means for constructing said bus control signal independently of said bus structure construction means.

2. The automatic placement and routing device according to claim 1, further comprising
   global routing result output means for performing global routing for constructing wire paths for interconnection between said cells, based on said cell placement information, to output a global routing result,
   wherein said bus structure construction result output means outputs said bus construction result, based on said global routing result in addition to said logic circuit information, said cell placement information and said bus information.

3. The automatic placement and routing device according to claim 1, further comprising:
   global routing result output means for performing global routing for constructing wire paths for interconnection between said cells, based on said cell placement information, to output a global routing result; and
   detail routing result output means for performing detail routing which is routing in consideration of a layout for connection between said cells, based on said global routing result, to output a detail routing result,
   wherein said bus structure construction result output means outputs said bus construction result, based on said detail routing result in addition to said logic circuit information, said cell placement information and said bus information.

4. The automatic placement and routing device according to claim 1,
   wherein said logic circuit information includes bus structure information which specifies said bus structure, and
   wherein said bus structure construction result output means further comprises bus structure reconstruction means for reconstructing said bus structure specified by said logic circuit information.

5. The automatic placement and routing device according to claim 1,
   wherein said bus structure construction result output means further comprises bus structure reconstruction means for reconstructing said bus structure constructed by said bus structure construction means and said bus control signal construction means,
   said bus structure reconstruction means comprising:
   cluster anomaly extraction means for extracting overlap of cluster regions and wire cross-over between different clusters; and
   cluster recombination means for recombining clusters so as to eliminate the overlap of the cluster regions and the wire cross-over which are extracted by said cluster anomaly extraction means.

6. The automatic placement and routing device according to claim 1,
   wherein said bus structure construction result output means receives at least one item of judgement information among items of information pertaining to a degree of congestion of routing, clusters, node potentials, power consumption and skew, to output said bus construction result so that a condition indicated by said at least one item of judgment information is satisfied.

7. The automatic placement and routing device according to claim 6, wherein said at least one item of judgement information includes a plurality of items of judgement information, and wherein said bus structure construction result output means further receives priority weight information specifying priority weight of each of said plurality of items of judgment information, to output said bus construction result so that the condition indicated by said plurality of items of judgement information is satisfied according to said priority weight specified by said priority weight information.

8. The automatic placement and routing device according to claim 1, wherein said bus structure construction result output means constructs said bus structure while forming a trunk wire connected commonly to a plurality of signal lines, to output said bus construction result.

* * * * *